(12) United States Patent
Magome

(10) Patent No.: US 6,798,516 B1
(45) Date of Patent: Sep. 28, 2004

(54) PROJECTION EXPOSURE APPARATUS HAVING COMPACT SUBSTRATE STAGE

(75) Inventor: Nobutaka Magome, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/634,328

(22) Filed: Aug. 7, 2000

Related U.S. Application Data

(62) Division of application No. 09/232,646, filed on Jan. 19, 1999, now Pat. No. 6,160,619, which is a continuation of application No. 08/969,924, filed on Nov. 14, 1997, now abandoned.

(30) Foreign Application Priority Data

Nov. 14, 1996 (JP) .............................................. 8-318657

(51) Int. Cl.⁷ .............................................. G01B 11/00
(52) U.S. Cl. ...................................... 356/401; 356/400
(58) Field of Search ................................ 356/401, 400, 356/490; 355/53, 55; 430/22, 30

(56) References Cited

U.S. PATENT DOCUMENTS

| | | |
|---|---|---|
| 4,861,162 A | 8/1989 | Ina |
| 5,003,342 A | 3/1991 | Nishi .......................... 355/43 |
| 5,243,195 A | 9/1993 | Nishi .......................... 250/548 |
| 5,523,841 A | 6/1996 | Nara et al. .................. 356/358 |
| 5,654,553 A * | 8/1997 | Kawakubo et al. ......... 356/400 |

FOREIGN PATENT DOCUMENTS

| | | |
|---|---|---|
| EP | 0 613 051 A1 | 8/1994 |
| JP | 7-103713 | 4/1995 |

* cited by examiner

Primary Examiner—Zandra V. Smith
(74) Attorney, Agent, or Firm—Westerman, Hattori, Daniels & Adrian, LLP

(57) ABSTRACT

The projection exposure apparatus is provided with a moving mirror (24X, 24Y) having a length Lm set so as to satisfy a relationship as represented by Lm<Dw+2BL, in which Dw is a diameter of a substrate stage (18) and BL is the distance between a projection center of an optical projection system (PL) and a detection center of a mark detection system (AS). The projection exposure apparatus having the moving mirror so set for its length Lm as to satisfy the above relationship can make the substrate stage (18) more compact in size and lighter in weight, thereby achieving improvements in performance of controlling the position of the substrate stage (18), as compared with a conventional exposure apparatus having a moving mirror set so as for its length to meet a relationship as represented by Lm>Dw+2BL.

143 Claims, 9 Drawing Sheets

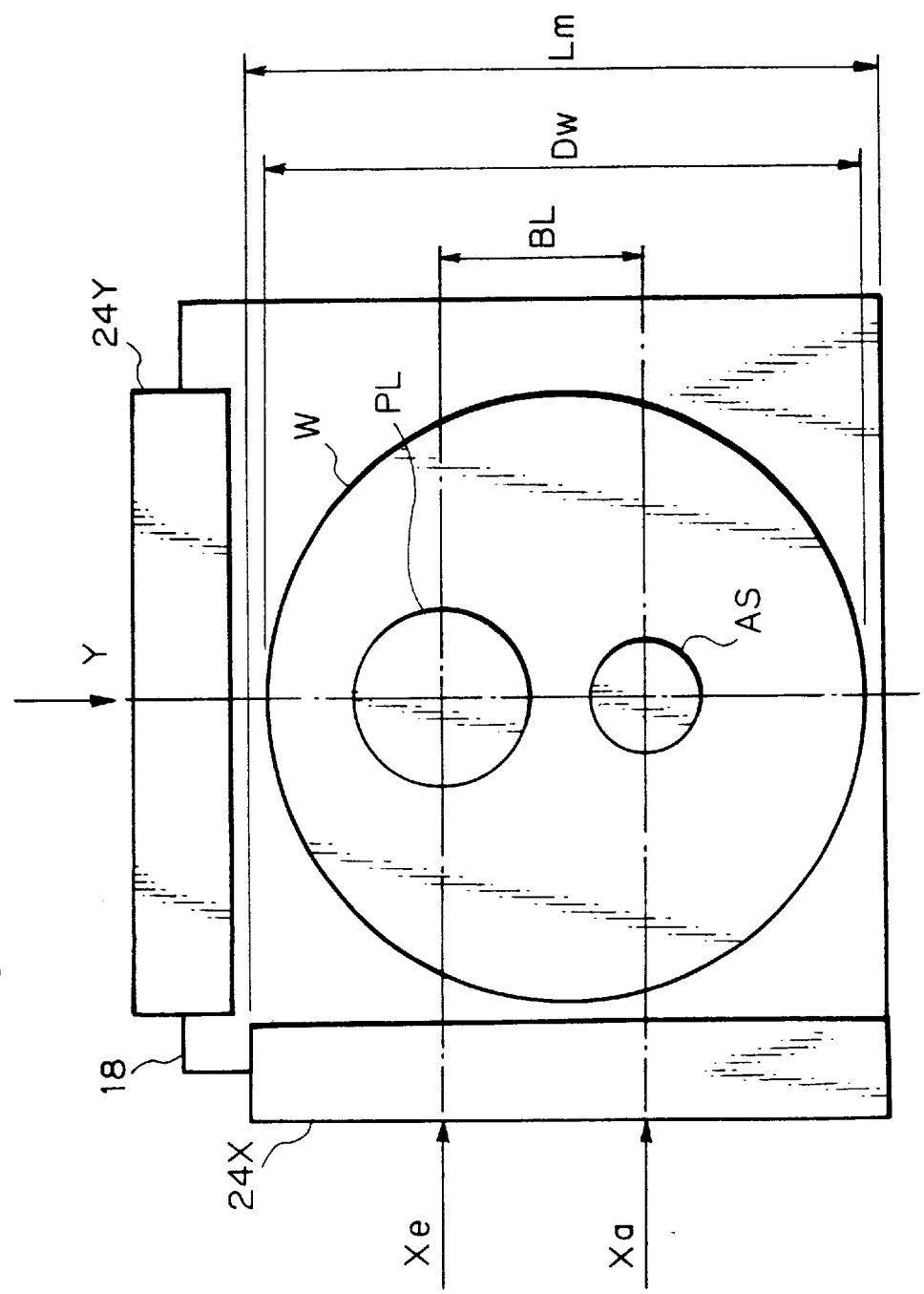

PROJECTION EXPOSURE APPARATUS HAVING COMPACT SUBSTRATE STAGE

This application is a divisional of prior application Ser. No. 09/232,646, filed on Jan. 19, 1999, now U.S. Pat. No. 6,160,619, which is a continuation of prior application Ser. No. 08/969,924, filed Nov. 14, 1997 now abandoned.

BACKGROUND OF THE INVENTION

The present invention relates to a projection exposure apparatus and, more particularly, to a projection exposure apparatus and a method for the exposure of a pattern of a mask onto a photosensitive substrate through an optical projection system, said pattern of the mask being so adapted as to be employed for manufacturing semiconductor elements, liquid crystal display elements and the like in a lithographic process.

In a lithographic process for manufacturing micro devices such as, for example, semiconductor elements, liquid crystal display elements, charge couple devices (CCD's), thin film magnetic heads and the like, there has been employed a projection exposure apparatus for projecting an image of a photomask or reticle (hereinafter referred to generally as "reticle") with a transcribing pattern formed thereon onto a substrate such as, for example, a wafer or a glass plate (hereinafter referred to as "wafer") with a photoresist material coated thereon through an optical projection system.

The projection exposure apparatus of this kind requires a reticle to be aligned with a wafer at a high degree of precision prior to exposure. In order to effect the alignment, the wafer is provided thereon with a mark for detecting a position (an alignment mark) which has been transcribed thereonto by the exposure in the lithographic process previously carried out, whereby the projection exposure apparatus can detect the position of the wafer or a circuitry pattern on the wafer with high precision by detecting the position of the alignment mark.

Hitherto, an alignment microscope for detecting such an alignment mark may be broken down roughly into an on-axis type for effecting the detection of the alignment mark through a projecting lens and an off-axis type for effecting the detection of the alignment mark without the use of a projecting lens, however, such an alignment microscope of an off-axis type will be more appropriate than that of an on-axis type for a projection exposure apparatus where there is employed an excimer laser light source which will become a mainstream for this purpose from now on. The reasons why the alignment microscope of such an off-axis type can be employed more advantageously than that of an on-axis type are because it allows a wider freedom of optical design without taking any chromatic aberration into account and it can use a variety of alignment systems due to the fact that it is mounted separately from the projecting lens, while the alignment microscope of such an on axis type cannot converge alignment light or cause a greater error due to chromatic aberration even if such alignment light would be converged, because the projecting lens is corrected for the chromatic aberration against exposure light. Further, for example, a phase-contrast microscope or a differential interference microscope may also be employed.

FIG. 10 is an abbreviated plan view showing a portion nearby a wafer table of a conventional projection exposure apparatus with an alignment microscope of an off-axis type. As shown in FIG. 10, the wafer table as a substrate stage on which a wafer W is placed is provided thereon with a Y-axially moving mirror 80Y having a surface reflecting at an angle normal to the Y-axis and an X-axially moving mirror 80X having a surface reflecting at an angle normal to the X axis. The Y-axially moving mirror 80Y is provided with a Y-axial interferometer, although not shown, and Y-axial interferometer beams in the measuring longitudinal axis in the Y-axial direction passing through a projection center of an optical projection system PL and a detection center of an alignment microscope 82 allows the measurement of the Y-axial displacement from the reference position of the Y-axially moving mirror 80Y, thereby determining the Y coordinate of the wafer table. On the other hand, an interferometer for measuring the X-coordinate of the wafer table is provided with an exposing X-axial interferometer for projecting interferometer beams in a measuring longitudinal axis Xe in the X-axial direction passing through the projection center of the optical projection system and with an aligning X-axial interferometer for projecting interferometer beams in a measuring longitudinal axis Xa in the X axial direction passing through the detection center of the alignment microscope 82.

As at least three interferometers are provided for measuring the positions of the wafer table as described hereinabove, the wafer table can be aligned by the aligning interferometer (the measuring longitudinal axis Xa, Y) at the time of alignment and the position of exposure can be measured and determined by the exposing interferometer (the measuring longitudinal axis Xe, Y) at the time of exposure, thereby allowing an accurate alignment and exposure so as to cause no Abbe's error due to the rotation of the wafer table.

As an interferometer for managing the position of the wafer table of a projection exposure apparatus, there has generally been employed a Twyman-Green interferometer. The Twyman-Green interferometer has a fixed light path having an unvariable arm length (a length of the light path), which is a light path of interferometer beams to an unshown fixed mirror, and a moving light path which allows its arm length to vary in accordance with the position of a moving mirror. It is further arranged so as to determine the position of the wafer table as a relative displacement between the fixed mirror and the moving mirror by comparing the arm lengths of the fixed light path and the moving light path. However, this interferometer determines the position of the wafer table by sequentially adding signals of the positions of the moving mirror one by one so that the position of the moving mirror cannot be measured if the interferometer beams were cut and they would not strike the moving mirror. Accordingly, it requires the interferometer beams to always strike the moving mirror. At this end, the conventional projection exposure apparatus is designed in such a manner that in order to effect alignment measurement and exposure over the entire surface of the wafer W, the length Lm of the moving mirror located in the longitudinal length of the wafer table (the X-axially moving mirror 80X as in FIG. 10) should be set so as to establish the relationship as follows:

$$Lm > Dw + 2BL$$

where Dw is the diameter of the wafer; and BL is the distance between the measuring longitudinal axes Xe and Xa. In other words, it is requisite for the length of the X-axially moving mirror to satisfy the above relationship.

Moreover, a wafer size becomes larger as the time passes and the technical innovation develops, and a wafer may recently be as large as 300 millimeters in diameter. Therefore, the length of the moving mirror should also be made longer, resulting in enlarging the size of a wafer table on which the moving mirror is mounted.

Further, since an alignment system for the projection exposure apparatus of an off-axis type has an alignment micro-scope mounted outside the optical projection system, the diameter of the optical projection system should become larger, too, as the N.A. of the optical projection system becomes higher and the field thereof becomes greater. Moreover, as the distance between the optical projection system and the alignment micro-scope becomes apart to a more extent, this causes the moving mirror to becomes longer in length and the wafer table to become greater in size.

The fact that the wafer table as a substrate stage becomes greater in size due to the various factors as described herein-above is now becoming a big issue to solve. In other words, the larger size and the greater weight of the substrate stage may cause the worsening of control and a decrease in throughput, thereby resulting in making the entire size of the apparatus larger and the entire weight thereof heavier.

Under such circumstances, great demands have been made to develop technology of making a substrate stage compact in size and consequently lighter in weight, thereby enabling control over a movement of the substrate stage at a higher speed and effecting alignment at a more accurate way.

SUMMARY OF THE INVENTION

Therefore, the present invention has a primary object to provide a projection exposure apparatus so adapted as to achieve an improvement in various performance, particularly in performance of controlling a substrate table.

Another object of the present invention is to provide a projection exposure apparatus so adapted as to manage a position of two-dimensional coordinates of a substrate stage with a high degree of precision at the time when a pattern of a mask is exposed through an optical projection system and when a mark on a photosensitive substrate is detected by a mark detection system.

The present invention has further objects to provide a projection exposure apparatus capable of making a N.A. of the optical projection system higher and making a field thereof greater in size while retaining the substrate table constant in size.

The present invention has still further objects to provide a projection exposure apparatus which is so adapted as to measure the position of the mark over the entire surface of the photo-sensitive substrate and to expose a pattern over the entire surface thereof through the optical projection system, without causing any disadvantage and difficulties even if the moving mirror and the substrate stage are made more compact in size and lighter in weight.

The present invention has a still further object to provide a projection exposure apparatus that can ensure stability of a baseline.

The present invention has a still further object to provide a projection exposure apparatus that makes the moving mirror and the substrate stage to be mounted thereon more compact in size and lighter in weight.

Moreover, the present invention has another objects to provide a projection exposure method for measuring a position of a mark with respect to the entire surface of a photosensitive substrate and for exposing a pattern with respect to the entire surface thereof, without causing any disadvantage and difficulties even if the moving mirror and the substrate stage are made more compact in size and lighter in weight.

In order to achieve the primary object as described herein above, the present invention provides a projection exposure apparatus for exposing an image of a pattern formed on a mask onto a photosensitive substrate through an optical projection system, which comprises a substrate stage disposed to move on a two-dimensional plane with the photosensitive substrate loaded thereon; a mark detection system disposed separately from the optical projection system for detecting a mark on the substrate stage or a mark on the photosensitive substrate; an interferometer system for managing a position of two-dimensional coordinates of the substrate stage; and a moving mirror disposed on the substrate stage for measuring a displacement from a reference position by the interferometer system; wherein a length Lm of the moving mirror is so set as to satisfy a relationship as follows:

$$Lm < Dw + 2BL$$

where Dw is a diameter Dw of the photosensitive substrate and BL is a distance between a projection center of the optical projection system and a detection center of the mark detection system.

The present invention further provides the projection exposure apparatus which further comprises the interferometer system having at least a first measuring longitudinal axis extending in a first axial direction connecting between the projection center of the optical projection system and the detection center of the mark detection system, a second measuring longitudinal axis extending in a second axial direction intersecting perpendicularly with the first measuring longitudinal axis at the projection center of the optical projection system, and a third measuring longitudinal axis extending in a third axial direction intersecting perpendicularly with the first measuring longitudinal axis at the detection center of the mark detection system.

Further, the present invention provides the projection exposure apparatus further comprising a control means for resetting an interferometer in the second measuring longitudinal axis in a state in which the substrate stage is aligned with a position in which a spatial relationship of a predetermined reference point on the substrate stage with a predetermined reference point within a projection region of the optical projection system is detectable within a projection region of the optical projection system and resetting an interferometer in the third measuring longitudinal axis in a state in which the substrate stage is aligned with a position in which a reference point on the substrate stage is located within the detection region of the mark detection system.

Furthermore, the present invention provides the projection exposure apparatus which further comprises a position detection means for detecting a spatial relationship of a position of the projection center of the image of the pattern of the mask with a position of the reference point on the substrate stage is detected through the mask and the optical projection system, wherein the position of the projection center of the image of the pattern of the mask is the reference point within the projection region of the optical projection system.

In addition, the present invention provides the projection exposure apparatus which further comprises a reference plate provided with a first reference mark and a second reference mark in a predetermined spatial relationship and loaded on the substrate stage; and a control means for resetting at least one of the interferometer in the second measuring longitudinal axis and the interferometer in the third measuring longitudinal axis in a state that the substrate stage is aligned with a predetermined position so as to locate the first reference mark of the reference plate within the detection region of the mark detection system and at the same time to locate the second reference mark of the reference plate in a position in which a spatial relationship with a position of a predetermined reference point within the projection region of the optical projection system is detectable.

The present invention additionally provides the projection exposure apparatus which further comprises a position detection means for detecting a spatial relationship of the projection center of the image of the pattern of the mask with a position of the second reference mark of the reference plate via the mask and the optical projection system, wherein the projection center of the image of the pattern of the mask is the reference point of the optical projection system within its projection region.

In addition, the present invention provides the projection exposure apparatus having the control means which is so configured as to effect the detection by the mark detection system and the detection by the position detection means simultaneously in a state that the substrate stage is aligned with the predetermined position.

Moreover, the present invention provides the projection exposure apparatus having the control means which resets the interferometer in the second measuring longitudinal axis after the measurement of the mark on the photosensitive substrate by the mark detection system has been finished and resets the interferometer in the third measuring longitudinal axis after exposure onto the photosensitive substrate via the optical projection system has been finished.

In order to further achieve the object as described herein above, the present invention provides a projection exposure method for exposing an image of a pattern formed on a mask to the photosensitive substrate through an optical projection system, which comprises detecting a spatial relationship of a predetermined reference point on a substrate stage on which to load the photosensitive substrate with an alignment mark on the photosensitive substrate loaded on the substrate stage; aligning the predetermined reference point on the substrate stage within a projection region of the optical projection system after the detection; detecting a deviation of a position of the predetermined reference point on the substrate stage with respect to the predetermined reference point within the projection region of the optical projection system; detecting a position of coordinates of the substrate stage; moving the substrate stage on the basis of the spatial relationship detected hereinabove, the deviation of the position detected hereinabove, and the position of the coordinates of the substrate stage detected hereinabove; and aligning the image of the pattern of the mask with the photosensitive substrate loaded on the substrate stage.

Further, the present invention provides a projection exposure method for exposing an image of a pattern formed on a mask onto each of plural shot areas on a photosensitive substrate through an optical projection system, which comprises detecting the position of each of a mark for detecting a position of a sample shot area selected from plural shot areas on the photo-sensitive substrate and a predetermined reference point on a substrate stage with said photosensitive substrate loaded thereon; computing a spatial relationship of the position of the predetermined reference point of the substrate stage with all the shot areas on the photosensitive substrate by operation on the basis of a result of detection obtained by the previous step; aligning the predetermined reference point on the substrate stage within a projection region of the optical projection system after the operation; detecting a deviation of a position of the predetermined reference point on the substrate stage with respect to the predetermined reference point within the projection region of the optical projection system; detecting a position of coordinates of the substrate stage; controlling a movement of the substrate stage on the basis of the spatial relationship of the positions obtained by the operation, the deviation of the position detected hereinabove, and the position of the coordinates of the substrate stage detected hereinabove; and aligning each of the shot areas on the photosensitive substrate loaded on the substrate stage with the image of the pattern of the mask.

Other objects, features and advantages of the present invention will become apparent in the course of the description of this specification with reference to the accompanying drawings.

BRIEF DESCRIPTION OF THE ACCOMPANYING DRAWINGS

FIG. 3 is an abbreviated plan view showing each portion of the configuration nearby a wafer table of the projection exposure apparatus of FIG. 1.

FIG. 5 is a view for describing a first reset function of an interferometer using a greater FM of a main control unit, in which

FIG. 6 is a view showing an enlarged size of a reference plate of FIG. 1, in which

Figure 7A:
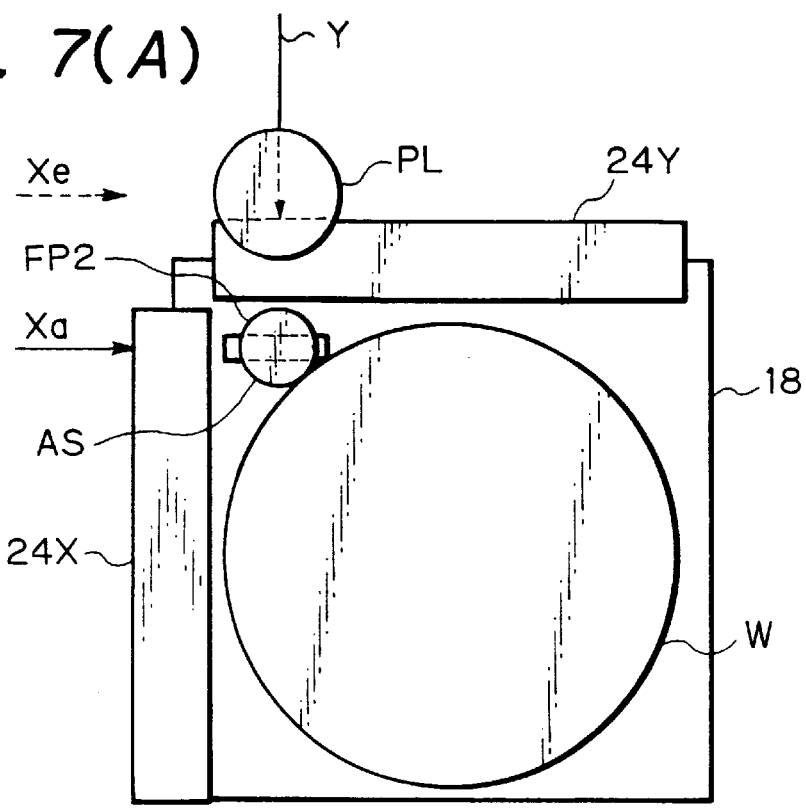
Figure 7B:
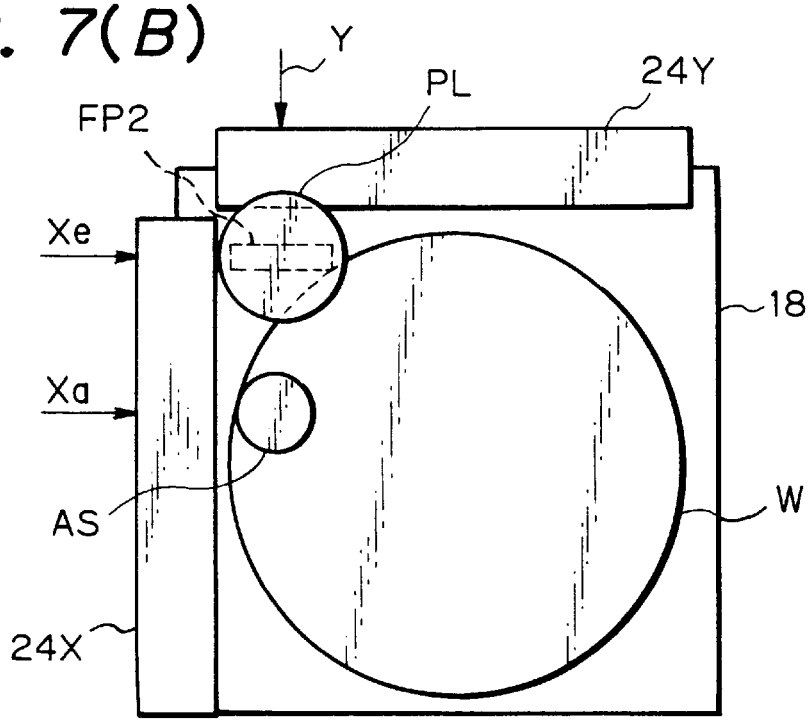

FIG. 7 is a view for describing the second reset function of an interferometer using a smaller FM of a main control unit, in which FIG. 7A is a view showing the state in which the wafer table is located in the position in which the interferometer in the measuring longitudinal axis Xa is reset and FIG. 7B is a view showing the state in which the wafer table is located in the position in which the interferometer in the measuring longitudinal axis Xe is reset.

Figure 8:
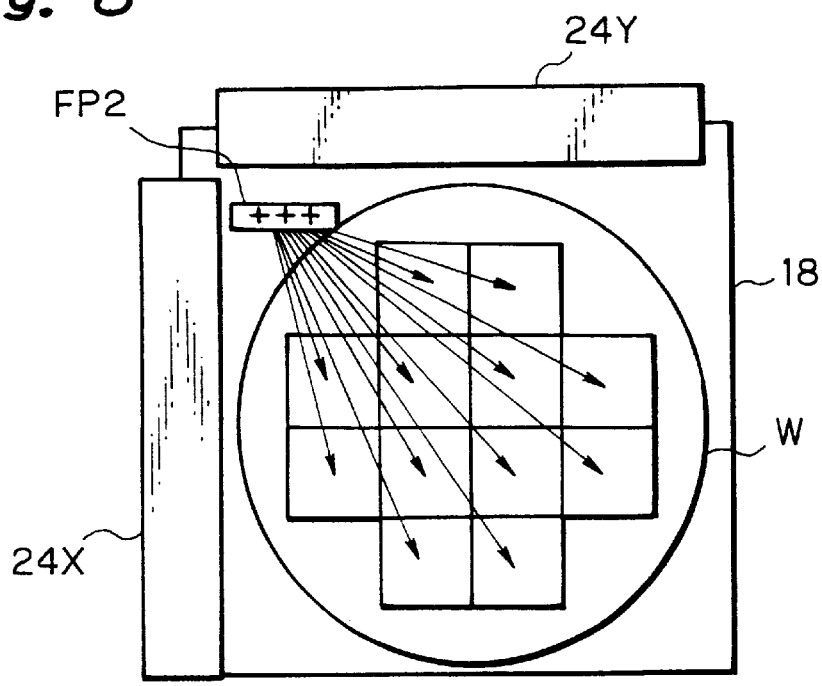

FIG. 8 is a view showing a visible relationship of relative positions between a reference mark on the reference plate and a position in each shot area on the wafer as a result of alignment measurement.

Figure 9:
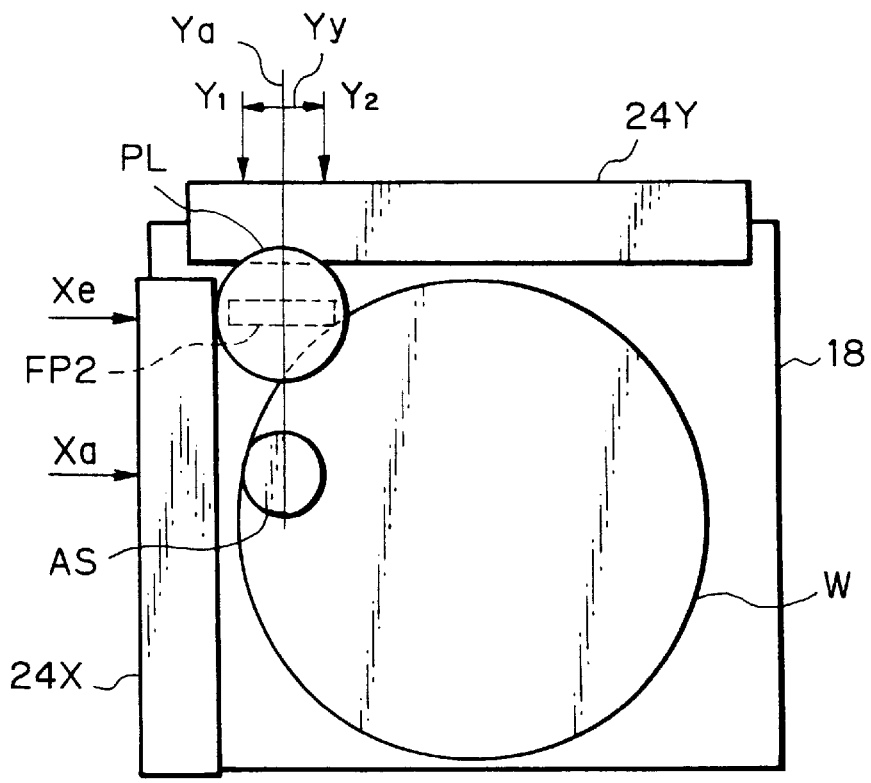

FIG. 9 is a view showing a variation of the above embodiment, in which a yawing interferometer is mounted as a Y-axial interferometer.

Figure 10:
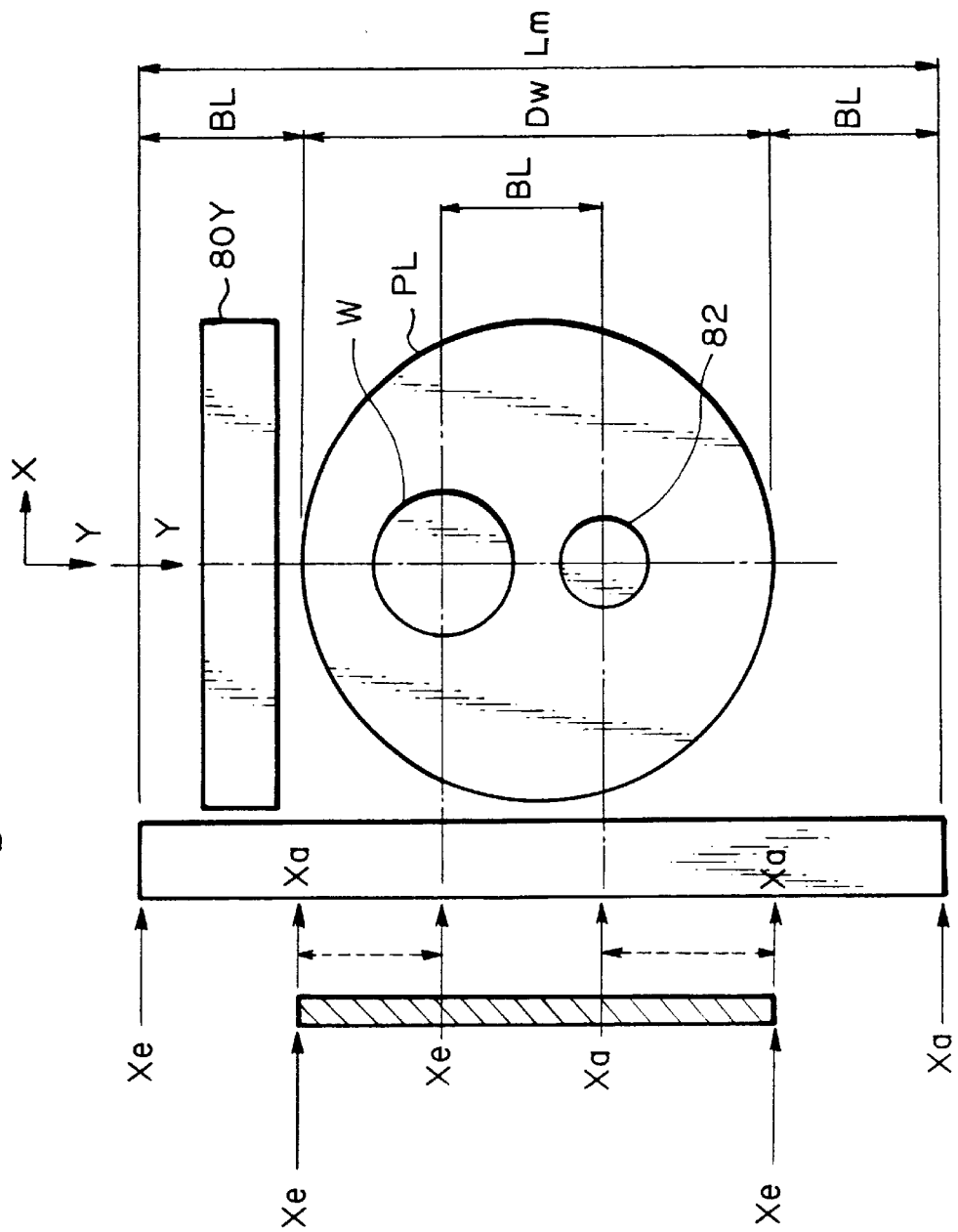

FIG. 10 is an abbreviated plan view showing each portion of the configuration near a wafer table of a conventional projection exposure apparatus.

DESCRIPTION OF THE PREFERRED EMBODIMENTS

The projection exposure apparatus according to an embodiment of the present invention will be described in more detail with reference to the accompanying drawings.

Figure 1:
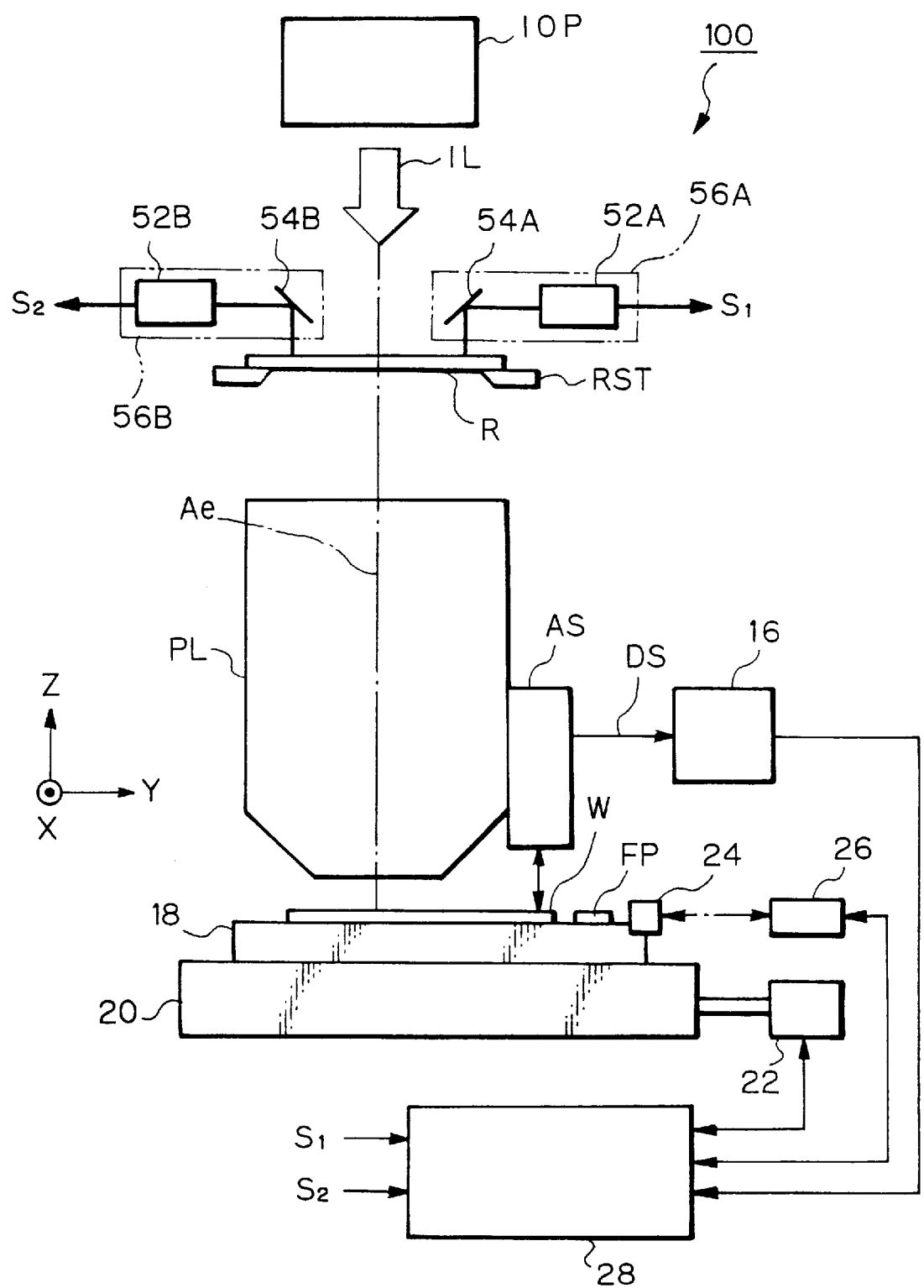
FIG. 1 is an abbreviated view showing the configuration of a projection exposure apparatus according to an embodiment of the present invention.

As shown in FIG. 1, the projection exposure apparatus according to the present invention is of a type capable of exposing an image of a pattern formed on a mask R to a photo-sensitive substrate W through an optical projection system PL. More specifically, the projection exposure apparatus comprises a substrate stage 18 with the photosensitive substrate W loaded thereon, disposed so as to move in a two-dimensional plane; a mark detection system AS for detecting a mark on the substrate stage 18 or on the photosensitive substrate W, disposed separately from the optical projection system PL; an interferometer system 26 for managing the position of two dimensional coordinates of the substrate stage 18; and moving mirrors 24X and 24Y located above the substrate stage 18 for allowing displacement from the reference position to be measured by the interferometer system 26; in which a length Lm of each of the moving mirrors 24X and 24Y establishes the relationship as follows: Lm<Dw+2BL, in which Dw is a diameter of the photosensitive substrate W and BL is a distance between the projection center of the optical projection system PL and the detection center of the mark detection system AS.

On the other hand, the conventional projection exposure apparatus is arranged in such a fashion that the length of a moving mirror Lm is set so as to establish the relationship: Lm>Dw+2BL. Therefore, as described hereinabove, the projection exposure apparatus according to the present invention has the length Lm of each of the moving mirrors set so as to satisfy the relationship: Lm<Dw+2BL, as shown in FIG. 3, the substrate stage 18 on which to mount the moving mirrors can be made more compact in size and lighter in weight, thereby achieving improvements in performance of controlling the position of the substrate stage 18, more specifically, in alignment precision, maximal speed, maximal acceleration and the like.

For the projection exposure apparatus according to the present invention, there may be employed any interferometer system, as the interferometer system 26, as long as it can manage the position of the two-dimensional coordinates of the substrate stage 18. It is preferred that the interferometer system has at least three measuring longitudinal axes, that is, a first measuring longitudinal axis Y extending in the first axial direction connecting the projection center of the optical projection system PL and the detection center of the mark detection system AS, a second measuring longitudinal axis Xe extending in the second axial direction and intersecting perpendicularly with the first measuring longitudinal axis Y at the projection center of the optical projection system PL, and a third measuring longitudinal axis Xa extending in the second axial direction and intersecting perpendicularly with the first measuring longitudinal axis Y at the detection center of the mark detection system AS. The interferometer system having the such measuring longitudinal axes can manage the position of the two dimensional coordinates of the substrate stage 18 with high precision, without causing a so-called Abbe's error even at the time when the pattern of the mask is exposed through the optical projection system PL and at the time when the mark on the photosensitive substrate W is detected by the mark detection system AS.

The projection exposure apparatus according to the present invention is further provided with a control means 28 which resets an interferometer 26Xe having the second measuring longitudinal axis Xe in such a state that the substrate stage 18 is aligned with a position in which the spatial relationship between a predetermined reference point on the substrate stage 18 in a projection region of the optical projection system PL and a predetermined reference point within a projection region of the optical projection system PL can be detected and which resets an interferometer 26Xa having the third measuring longitudinal axis Xa in such a state that the substrate stage 18 is aligned so as to allow the reference point on the substrate stage 18 to locate within a detection region of the mark detection system AS.

With the arrangement as described hereinabove, when the interferometer 26Xe having the second measuring longitudinal axis Xe is brought into an unmeasurable state, the control unit 28 once moves the substrate stage 18 to a position in which the reference point on the substrate stage 18 is located on the first measuring longitudinal axis on the basis of measured value during a period of time when the interferometer 26Xa having the third measuring longitudinal axis Xa is still active, and then resumes a movement of the substrate stage 18 from this position on the basis of the values measured by the interferometer 26Y having the first measuring longitudinal axis Y, thereby resetting the interferometer 26Xe having the second measuring longitudinal axis Xe in the such state in which the substrate stage 18 is aligned with the position in which the spatial relationship between the position of the predetermined reference point on the substrate stage 18 in the projection region of the optical projection system PL and the position of the predetermined reference point in the projection region of the optical projection system PL is detectable. On the other hand, when the interferometer 26Xa having the third measuring longitudinal axis Xa is brought into an unmeasurable state, the control unit 28 once moves the substrate stage 18 to the position in which the reference point on the substrate stage is located on the first measuring longitudinal axis Y on the basis of the measured value during a period of time when the interferometer 26Xe having the second measuring longitudinal axis Xe is still active, and then resumes a movement of the substrate stage 18 from this position on the value measured by the interferometer 26Y having the first measuring longitudinal axis Y, whereby the interferometer 26Xa having the third measuring longitudinal axis Xa is reset in the such state in which the substrate stage 18 is aligned with a predetermined position (i.e. the reset position of the interferometer having the third measuring longitudinal axis) in which the reference point on the substrate stage is located in the detection region of the mark detection system AS.

With the arrangement of the projection exposure apparatus according to the present invention as described hereinabove, the length of the substrate stage 18 can be set so as to become approximately as long as a diameter of a wafer W regardless the size of an baseline amount BL because the substrate stage 18 can be aligned with the reset position on the basis of the measured value of the interferometer having the first measuring longitudinal axis Y even if both the interferometer having the second measuring longitudinal axis and the interferometer having the third measuring longitudinal axis would have been brought into an unmeasurable state during a movement of the substrate stage to the reset position of the interferometer. Therefore, the projection exposure apparatus according to the present invention can readily make the N.A. of the optical projection system PL higher and the field thereof larger in order to improve resolving power, while retaining the size of the substrate stage constant.

Further, it is also possible as a matter of course that, if either one of the interferometers having the second and third measuring longitudinal axes would be kept in a measurable state over the entire period of time when the substrate stage is being moved to the reset position of the other interferometer, the substrate stage can be directly aligned with the reset position of the other interferometer on the basis of the measured values of the one interferometer and the interferometer having the first measuring longitudinal axis.

In this case, it is preferred that the projection exposure apparatus according to the present invention further comprises position detection means 52A and 52B for detecting the spatial relationship between the position of the projection center of an image of the pattern of the mask, that is the reference point within the projection region of the optical projection system PL, and the reference position on the substrate stage 18 via the mask R and the optical projection system PL. In such a case, the spatial relationship of the projection center of the image of the pattern of the mask R with the reference point on the substrate stage 18 can be detected by the position detection means 52A and 52B prior to the resetting of the interferometer 26Xe having the second measuring longitudinal axis Xe, upon alignment of the substrate stage 18 with the position in which the spatial relationship of the position of the predetermined reference point on the substrate stage 18 within the projection range of the optical projection system PL with the position of the projection center of the pattern image of the mask is detectable, that is, with the reset position of the interferometer having the second measuring longitudinal axis.

In a preferred aspect of the present invention, the projection exposure apparatus having the interferometer system is further provided with a reference plate FP1 loaded on the substrate stage 18, which has a first reference mark 30-1 and second reference marks 32-1 and 32-2 formed in a predetermined spacial relationship; and a control means 28 so adapted as to reset at least one of the interferometer having the second measuring longitudinal axis and the interferometer having the third measuring longitudinal axis in such a state in which the substrate stage 18 is aligned with the predetermined position, i.e. with the reset position of the interferometer having the second measuring longitudinal axis and the interferometer having the third measuring longitudinal axis so as to locate the first reference mark 30-1 of the reference plate FP1 within the detection region of the mark detection system AS and to locate the second reference marks 32-1 and 32-2 of the reference plate FP1 in a position in which the spatial relationship with the position of the predetermined reference point within the projection region of the optical projection system PL is detectable.

With the arrangement as described hereinabove, the control means 28 aligns the substrate stage 18 with the predetermined position, i.e. with the reset position of the interferometer having the second measuring longitudinal axis and the interferometer having the third measuring longitudinal axis, so as to locate the first reference mark 30-1 of the reference plate FP1 within the detection region of the mark detection system AS and simultaneously to locate the second reference marks 32-1 and 32-2 of the reference plate FP1 in a position in which the spacial relationship with the predetermined reference point within the projection region of the optical projection system PL is detectable. In this state, at least one of the interferometers having the second and third measuring longitudinal axes is reset.

In other words, when one of the interferometers having the second and third measuring longitudinal axes be brought into an unmeasurable state, the control means 28 is so disposed as to align the substrate stage 18 with the reset position on the basis of the value measured by the other interferometer and the interferometer having the first measuring longitudinal axis and then to reset the one or both of the interferometers having the second and third measuring longitudinal axes. Hence, simply by presetting the moving region of the substrate stage so as for both of the interferometer in the second measuring longitudinal axis and the interferometer in the third measuring longitudinal axis to simultaneously fail to fall into an unmeasurable state, the position of the mark can be measured over the entire surface of the photosensitive substrate and the pattern can be exposed through the optical projection system, without causing any inconvenience and difficulties even if the moving mirror and the substrate stage are made more compact in size and lighter in weight.

In this case, however, it is prerequisite that the first reference mark 30-1 and the second reference marks 32-1 and 32-2 are previously provided on the reference plate FP1 in such a likewise spatial relationship as between the optical projection system PL and the mark detection system AS.

In the such case, too, it is preferred that the projection exposure apparatus according to the present invention further comprises position detection means 52A and 52B for detecting the spatial relationship between the projection center of the image of the pattern of the mask R, that is the reference point within the projection region of the optical projection system PL, and the second reference marks 32-1 and 32-2 of the reference plate FP1 via the mask R and the optical projection system PL. With this arrangement of the projection exposure apparatus according to the present invention, the spatial relationship of the positions between the projection center of the pattern image of the mask and the second reference marks 32-1 and 32-2 through the mask R and the optical projection system PL can be detected by the position detection means 52A and 52B, before resetting the interferometer in the second measuring longitudinal axis Xe or the interferometers for the second and third measuring longitudinal axes, upon alignment of the substrate stage 18 with the reset position as described hereinabove.

In a further preferred aspect of the present invention, the projection exposure apparatus is provided with the control means 28 so adapted as to simultaneously effect the detection by the mark detection system AS and by the position detection means 52A and 52B, in such a state that the substrate stage 18 is aligned with the predetermined position. It is to be noted herein that the term "simultaneously" or related terms referred to herein are intended to mean the state in which the detection is effected at the same time as well as the state in which the substrate stage is stayed in an unmoving state after alignment with the predetermined position (the reset position).

In the latter case, it is possible to measure the baseline while the substrate stage is stayed still in a one position so that the measurement of the interferometers can be effected without undergoing any adverse influence by disturbance of air or for other reasons, thereby ensuring stability in a baseline amount that is one of the most significant factors for the mark detection system of an off-axis type.

In a still further aspect of the present invention, the projection exposure apparatus is provided with the control means so adapted as to reset the interferometer in the second measuring longitudinal axis after the measurement of the mark on the photosensitive substrate W by the mark detection system AS has been finished and, on the other hand, to reset the interferometer in the third measuring longitudinal axis after the exposure of the photosensitive substrate by the optical projection system has been finished.

With this arrangement as described hereinabove, if the interferometer in the third measuring longitudinal axis becomes in an unmeasurable state during the exposure of the photosensitive substrate W to the pattern through the optical projection system PL, the interferometer in the third measuring longitudinal axis can be reset after the exposure has been finished. On the other hand, if the interferometer in the second measuring longitudinal axis becomes in an unmeasurable state in the process of finishing the measurement of the mark on the photo-sensitive substrate by the mark detection system AS, the interferometer in the second measuring longitudinal axis can be reset after the measurement has been finished. Therefore, even if a situation would occur where the interferometer in the third measuring longitudinal axis is brought into an unmeasurable condition during exposure by the optical projection system PL or where the interferometer in the second measuring longitudinal axis becomes in an unmeasurable state during measuring the position-detecting mark by the mark detection system AS, no serious inconvenience and difficulties will be caused to occur so that the length of the moving mirror can be shortened accordingly, more specifically, to approximately a diameter of the photosensitive substrate W.

Moreover, the present invention provides the projection exposure method for exposing an image of a pattern formed on a mask R to a photosensitive substrate W by projection via the optical projection system PL, which comprises detecting a spatial relationship between a predetermined reference point on the substrate stage 18 with the photosensitive substrate W loaded thereon and an alignment mark formed on the photosensitive substrate W loaded on the substrate stage 18; aligning the predetermined reference point on the substrate stage 18 within a projection region of the optical projection system PL after the above detection; detecting a deviation of the position of the reference point on the substrate stage 18 with respect to the predetermined reference point within the projection region of the optical projection system PL; detecting a position of coordinates of the substrate stage 18; controlling a movement of the substrate stage on the basis of the detected spatial relationship, the detected deviation and the detected position of the coordinates thereof; and aligning the image of the pattern of the mask with the photosensitive substrate loaded in the substrate stage 18.

With the arrangement of the projection exposure method as described hereinabove, the predetermined reference point on the substrate stage 18 is aligned within the projection region of the optical projection system PL after the spatial relationship of the predetermined reference point on the substrate stage 18 with the alignment mark on the photosensitive substrate W has been detected, followed by detecting a deviation of the position of the predetermined reference point on the substrate stage 18 with respect to the position of the predetermined reference point within the projection region of the optical projection system PL and detecting the position of the coordinates of the substrate stage 18 upon detecting the deviation of the predetermined reference point on the substrate stage 18. Further, the movement of the substrate stage is controlled on the basis of the detection results obtained above, and then the image of the pattern of the mask R is aligned with the photosensitive substrate W loaded on the substrate stage 18. Therefore, the projection exposure method according to the present invention can align the image of the pattern of the mask R with the photosensitive substrate W loaded on the substrate stage 18 with a high degree of precision without causing any inconvenience and difficulties, even if the interferometer or a coordinates system for managing the position of the substrate stage 18 to be employed upon detection of the spatial relationship of the predetermined reference point on the substrate stage 18 with the alignment mark on the photosensitive substrate W would be identical to or different from the interferometer or a coordinates system for managing the position of the substrate stage 18 upon detection of the such deviation and upon detection of the position of the coordinates of the substrate stage.

Therefore, for instance, when an alignment system of an off-axis type is employed as a mark detection system for detecting an alignment mark, it is not required to measure a spatial relationship of the predetermined reference point within the projection region of the optical projection system, i.e. the projection center of the pattern image of the mask, with the detection center of the alignment system, that is, to measure a baseline amount, thereby resulting in the situation that no inconvenience will be caused even if the optical projection system would be provided in a position remote from the position of the alignment system and as a consequence that the size of the substrate stage can be set regardless of the magnitude of the baseline amount. Further, even if the substrate stage is made more compact in size and lighter in weight, the mark can be measured over the entire surface of the photosensitive substrate and the pattern can be exposed to the entire surface thereof via the optical projection system without causing any inconvenience and disadvantage. Further, in this case, the measurement of the position of the mark and the exposure to the pattern undergo any adverse influence from a deviation in the baseline amount.

Further, the present invention provides a projection exposure method for exposing an image of a pattern formed on a mask R to each of plural shot areas formed on a photosensitive substrate W by projection through the optical projection system PL, which comprises detecting a position of a predetermined reference point on a substrate stage with the photosensitive substrate W loaded thereon and a position of a mark for detecting a position of a sample shot area selected from the plural shot areas formed thereon; calculating and determining a spatial relationship between the predetermined reference point on the substrate stage and all the plural shot areas on the photosensitive substrate on the basis of the detection results obtained above; aligning the predetermined reference point on the substrate stage within a projection region of the optical projection system after calculation; detecting a deviation of the position of the predetermined reference point on the substrate stage with respect to a projection center of the image of the pattern formed on the mask R; detecting a position of coordinates of the substrate stage; controlling a movement of the substrate stage on the basis of the calculated spatial relationship, the detected deviation and the detected position of the coordinates thereof; and aligning the image of the pattern thereof with the photosensitive substrate loaded on the substrate stage.

With the arrangement of the projection exposure method according to the present invention as described hereinabove, the position of the predetermined reference point on the substrate stage 18 and the position of the alignment mark for measuring the position of the sample shot area on the photosensitive substrate W are detected, and the spatial relationship of all the shot areas on the photosensitive substrate with the predetermined reference point on the substrate stage is then calculated and determined on the basis of the results detected above. Thereafter, the predetermined reference point on the substrate stage 18 is aligned within the projection region of the optical projection system PL, followed by detecting a deviation of the predetermined reference point on the substrate stage from the projection center of the image of the pattern of the mask by the optical projection system and detecting the position of the coordinates of the substrate stage upon detection of the such deviation. Based on these detection results, the movement of the substrate stage is controlled, thereby aligning the image of the pattern of the mask with each of the shot areas on the photosensitive substrate loaded on the substrate stage. In this case, too, likewise, the image of the pattern of the mask can be aligned with the photosensitive substrate loaded on the substrate stage with a high degree of precision without causing any inconvenience and difficulties, even if the interferometer or a coordinates system for managing the position of the substrate stage 18 upon detection of the spatial relationship of the predetermined reference point on the substrate stage with the alignment mark on the photosensitive substrate W would be identical to or different from the interferometer or a coordinates system for managing the position of the substrate stage upon detection of the such deviation and upon detection of the position of the coordinates of the substrate stage.

Therefore, in this preferred aspect of the projection exposure method according to the present invention as described hereinabove, the size of the substrate stage can be set regard-less of the magnitude of the baseline amount in a manner similar to the another aspect of the projection exposure method as described hereinabove, thereby enabling a measurement of the mark over the entire surface of the photosensitive substrate and exposing the pattern to the entire surface thereof through the optical projection system without causing any inconvenience and difficulties even if the substrate stage is made more compact in size and lighter in weight.

The present invention will be described in more detail with reference to the accompanying drawings.

FIG. 1 shows the configuration of a projection exposure apparatus 100 according to an embodiment of the present invention, which is an exposure apparatus of a reduced projection type in a step-and-repeat system (a so-called "stepper").

As shown in FIG. 1, the projection exposure apparatus 100 comprises an illumination system IOP, a reticle stage RST for holding a reticle R as a mask, an optical projection system PL for projecting an image of a pattern formed on the reticle R onto a wafer W as a photosensitive substrate, an XY-stage 20 for holding the wafer W so as to move in a two-dimensional plane, i.e. an XY plane, a drive system 22 for driving the XY-stage 20, and a main control unit 28 as a control means for controlling the entire system of the apparatus, which consists of a mini-computer or a microcomputer containing a CPU, a ROM, a RAM, an I/O interface and the like.

The illumination system IOP comprises a light source, such as a mercury lamp or an excimer laser, and an optical illumination system, such as a fly-eye lens, a relay lens, a condenser lens and the like. The illumination system IOP is disposed so as for an illuminating light IL for use in exposure from the light source to illuminate a pattern of the reticle R from its bottom plane with the pattern formed thereon at a uniform distribution rate of illuminance. As the illuminating light IL, there may be employed bright line, such as i-rays of a mercury lamp or excimer laser beams, such as KrF, ArF or the like.

On the reticle stage RST is fixed the reticle R via a fixing means, although not shown in the drawings. The reticle stage RST is so disposed as to be minutely driven by a drive system, although not shown, in an X-axial direction (in the direction perpendicular to the paper plane of FIG. 1), a Y-axial direction (in the direction extending lengthwise (toward the right and the left) on the paper of FIG. 1) and a q direction (in the direction of rotation in the XY plane). This allows the reticle stage RST to align the reticle R in such a state that the center of the pattern of the reticle R, i.e. the reticle center, coincides substantially with the light axis Ae of the optical projection system PL. FIG. 1 shows the state in which the alignment of the reticle is effected.

The optical projection system PL has the light axis Ae extending in the Z-axial direction intersecting with the plane on which the reticle stage RST moves. The optical projection system PL used herein may be of a type having both sides made telecentric and having a predetermined reduction ratio b, in which b may be ⅕. With this arrangement as described herein-above, when the reticle R is illuminated at a uniform rate of illuminance with the illuminating light IL in the state that the pattern of the reticle R is aligned with the shot area on the wafer W, the pattern on the pattern-formed plane of the mask is reduced at the reduction ratio b and projected onto the wafer W on which a photoresist coating is formed, thereby forming a reduced image of the pattern in each of the shot areas on the wafer W.

The XY-stage 20 comprises a Y-stage moving in the Y-axial direction on a base, although not shown, and an X-stage moving in the X-axial direction on the Y-stage thereon. In FIG. 1, the Y-stage and the X-stage are referred to collectively as the XY-stage 20. On the XY-stage 20 is loaded a wafer table 18 as the substrate table, and the wafer W is held on the wafer table 18 through a wafer holder, although not shown, by means of vacuum adsorption or for other means.

The wafer table 18 is so configured as to minutely move in the Z-axial direction integrally with the wafer holder with the wafer W held thereon. Therefore, the wafer table 18 may also be referred to as "Z-stage". The position of the two-dimensional XY-coordinates of the wafer table 18 is managed by an interferometer system 26 through a moving mirror 24.

Figure 2:
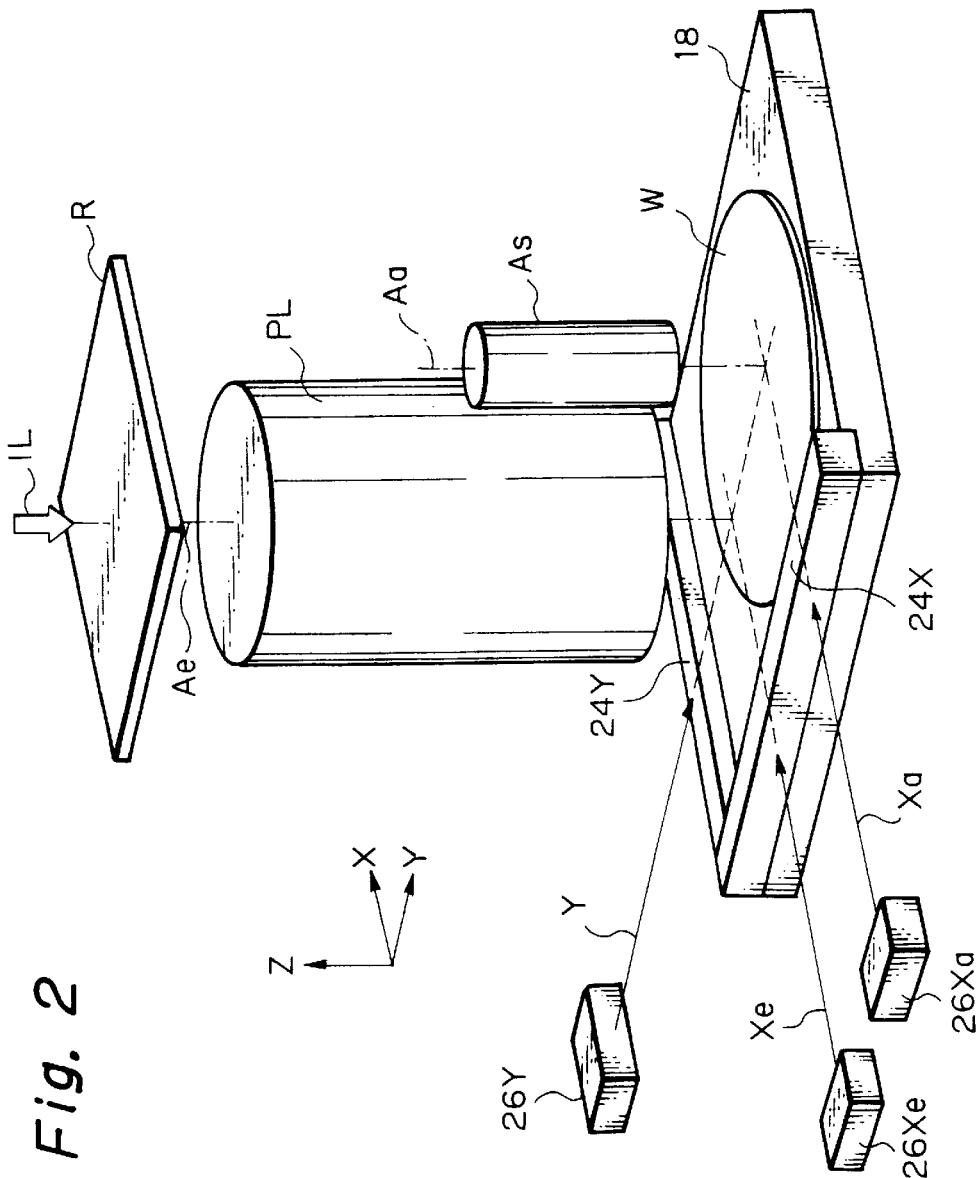
FIG. 2 is an abbreviated perspective view showing each portion of the configuration nearby a wafer table of the projection exposure apparatus of FIG. 1.

As shown in FIG. 2, the wafer table 18 is provided thereon with an X-axially moving mirror 24X having a reflecting plane intersecting at a right angle with the X-axis and a Y-axially moving mirror 24Y having a reflecting plane intersecting at a right angle with the Y-axis. The wafer table 18 is further provided with laser interferometers 26Xe and 26Xa for measuring the positions in the X axial direction and with a laser interferometer 26Y for measuring the position in the Y-axial direction, respectively, which are disposed to measure a relative displacement of each of the moving mirrors 24X and 24Y from the reference positions located in the direction of their respective measuring longitudinal axes by projecting laser beams to the moving mirrors 24X and 24Y and receiving the light reflected therefrom. In FIG. 1, in this embodiment, these elements are referred to collectively as the moving mirror 24 and the interferometer system 26. In other words, in this embodiment, the interferometer system 26 is constituted by the laser interferometers 26Xe, 26Xa and 26Y.

It is to be noted herein that the measuring longitudinal axis Y of the laser interferometer 26Y intersects perpendicularly with one of the measuring longitudinal axes of the X-axial laser interferometers, i.e. the measuring longitudinal axis Xe of the X axial laser interferometer 26Xe, at the center of the light axis Ae (the projection center) of the optical projection system PL. Further, it is to be noted herein that the measuring longitudinal axis Y of the laser interferometer 26Y intersects perpendicularly with the other of the measuring longitudinal axes of the X-axial laser interferometers, i.e. the measuring longitudinal axis Xa of the X-axial laser interferometer 26Xa, at the center of the light axis Aa (the detection center) of an alignment sensor As, as will be described herein-after. This arrangement can measure the position of the wafer table 18 in the measuring axial direction with high precision without undergoing any influence from the Abbe's error to be otherwise caused by yawing of the wafer table 18 or for other reasons upon exposure of the pattern onto the wafer W as well as upon measurement of the mark (alignment mark) for detecting the position on the wafer W, as will be described in more detail hereinafter.

In this embodiment, as the three interferometers, there may be employed each the interferometer of a type so designed as to measure the displacement of the moving mirrors with respect to the fixed mirror on the basis of the interference state in which reference beams (not shown) are projected onto the fixed mirror, although not shown, and the measuring longitudinal beams for measuring the longitudinal distance are projected onto the moving mirrors, and the two beams reflected therefrom are united together into one resulting in interference with each other. It is preferred accordingly that there are employed heterodyne interferometers having two wavelengths as the such interferometers in order to improve precision in measurement.

Turning back to FIG. 1, the measured value of the interferometer system 26 is fed to the main control unit 28 which in turn effects alignment of the wafer table 18 by driving the XY-stage 20 through the drive system 22 while monitoring the values to be measured by the interferometer system 26. In addition, an output of a focus sensor (not shown) is also fed to the main control unit 28 to drive the wafer table 18 in the Z-axial direction (in the focusing direction) via the drive system 22 on the basis of the output from the focus sensor. In other words, the wafer W is aligned in the three directions, that is, in the X-, Y- and Z-axial directions, through the wafer table 18 in the manner as described hereinabove.

Further, the reference plate FP is fixed on the wafer table 18 so as for its upper surface to become substantially on a level with the upper surface of the wafer W. The reference plate FP is formed on its surface with a variety of reference marks. Such specific examples will be described hereinafter.

Furthermore, in this embodiment, the optical projection PL is provided on its side surface with the alignment sensor AS of an off axis type as a mark detection system for detecting the mark for detecting the position formed on the wafer W. It is to be noted herein that the wafer W is provided with steps by means of exposure and process treatments for the previous layers. Among the such steps, there may be included the position-detecting mark (the alignment mark) for measuring the position of each shot area on the wafer, and the alignment mark can be measured by the alignment sensor AS.

In this embodiment, as the alignment sensor AS, there may be employed an alignment sensor of a so-called field image alignment (FIA) type of an image processing system, as disclosed in U.S. Pat. No. 5,493,403. With this alignment sensor AS, an illuminating light emitted from a light source (not shown) sending out a broad-banded illuminating light, such as a halogen lamp or the like, has first passed through an objective lens, although not shown, and then irradiated upon the wafer W or the reference plate FP. The light irradiated thereupon is then reflected from the wafer mark region (not shown) on the surface of the wafer W, and the reflected light passes through the objective lens and then through the reference plate, followed by forming an image of the wafer mark on an image-forming surface of a charge couple device (CCD) or other substrate, not shown, and at the same time by forming an index image on an index plate (not shown). The photo-electrically converting signals of these images are then processed by a signal processing circuit (not shown) disposed in a signal processing unit 16, and a position of the wafer mark relative to the index is calculated by an operation circuit, although not shown, and the relative position is then transmitted to the main control unit 28. Then, the main control unit 28 computes and determines the position of the alignment mark on the wafer W on the basis of the relative position and the measured value of the interferometer system 26.

In addition to the alignment sensor of the FIA type, as alignment sensors, there may also be employed an optical alignment type including, for example, an alignment sensor of a laser interferometric alignment (LIA) type or of a laser step alignment (LSA) type, as disclosed in U.S. Pat. No. 5,151,750, other optical devices such as a phase microscope or a differential interference microscope, and a non-optical device such as a scanning tunnel microscope (STM) for detecting a deviation of atomic levels on the plane of a sample by taking advantage of the tunnel effect or an atomic force microscope (AFM) for detecting a deviation of atomic or molecular levels on the plane of a sample by taking advantage of the force between atoms (attracting and repelling forces).

Further, as disclosed in U.S. Pat. No. 5,243,195, the projection exposure apparatus according to this embodiment of the present invention is provided above the reticle R with reticle alignment microscopes 52A and 52B as a position detection means for monitoring an image of the reference mark on the reference plate FP simultaneously with the mark on the reticle R via the optical projection system PL. The detected signals S1 and S2 from the respective reticle alignment microscopes 52A and 52B are fed to the main control unit 28. In this case, in order to lead the detection light from the reticle R to the reticle alignment microscopes 52A and 52B, polarizing mirrors 54A and 54B are united integrally with the respective reticle alignment microscopes 52A and 52B into a unit so as to form a pair of microscope units 56A and 56B, respectively. The microscope units 56A and 56B are so disposed as to be evacuated by a mirror drive unit (not shown) to the position in which the light does not strike the pattern plane of the reticle, once the exposure sequence starts, upon an instruction by the main control unit 28.

In this embodiment, as shown in FIG. 3, as each of the moving mirrors 24X and 24Y, there is employed a moving mirror having a length Lm slightly longer than a diameter Dw of the wafer W.

Figure 4A:
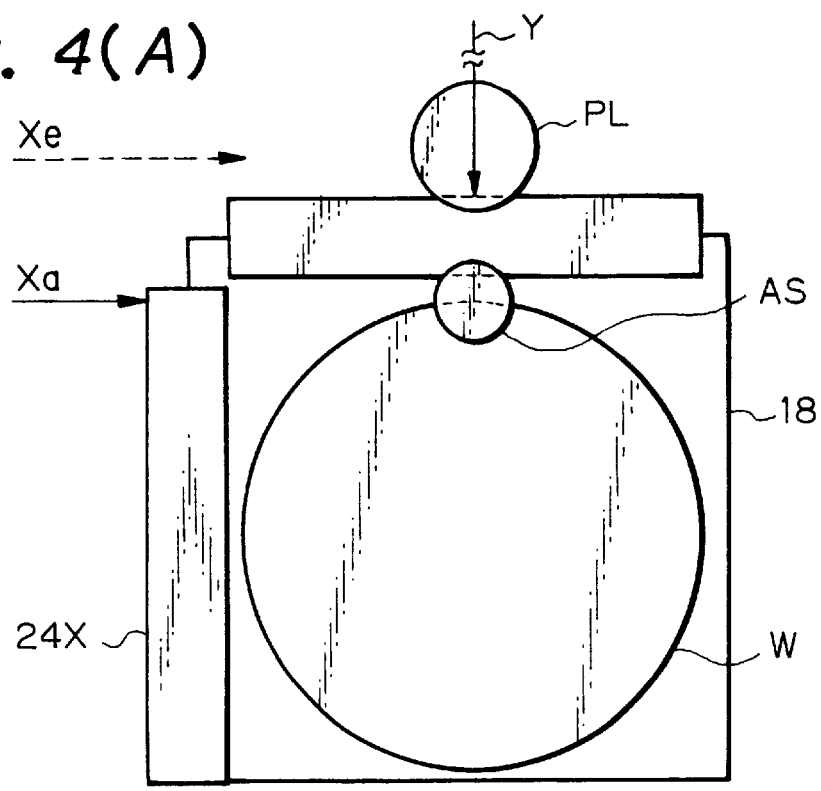
FIG. 4A is a view showing a state in which measuring longitudinal beams in the measuring longitudinal axis Y becomes the longest in a range in which the wafer table moves.
Figure 4B:
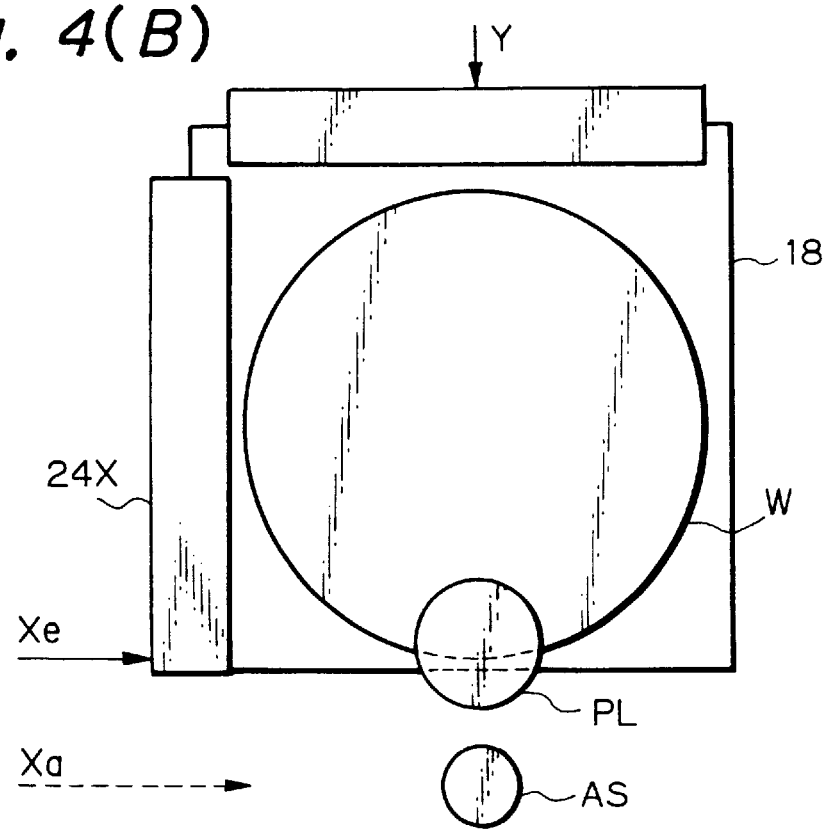
FIG. 4B is a view showing a state in which measuring longitudinal beams in the measuring longitudinal axis Y becomes the shortest in a range in which the wafer table moves.

With this arrangement as described hereinabove, on the one hand, measuring longitudinal beams extending in the measuring longitudinal axis Xe do not strike the moving mirror 24X in such a state as shown in FIG. 4A in which the measured value by the interferometer 26Y becomes maximal within the moving scope of the wafer table 18, i.e. in which the measuring longitudinal beams extending in the measuring longitudinal axis Xe are maximal, and, on the other hand, measuring longitudinal beams extending in the measuring longitudinal axis Xa do not strike the moving mirror 24X in such a state as shown in FIG. 4B in which the measured value by the interferometer 26Y becomes minimal within the moving scope of the wafer table 18, i.e. in which the measuring longitudinal beams extending in the measuring longitudinal axis Xe are minimal. In other words, the state of FIG. 4A is a state in which an outline of an upper side of the wafer W, as shown in FIG. 4A, overlaps with the detection center of the alignment sensor AS and the state of FIG. 4B is a state in which an outline of a lower side of the wafer W, as shown in FIG. 4B, overlaps with the projection center of the optical projection system PL.

In these cases, if the position of the wafer table 18 would be managed in a conventional manner by using a conventional interferometer, the former state makes it difficult to control the position of the wafer table 18 during exposure and the latter makes it difficult to control the position of the wafer table 18 during alignment. Accordingly, in this embodiment, in order to avoid such difficulties, the main control unit 28 is provided with, a reset function for the interferometers as will be described hereinafter.

On the other hand, measuring longitudinal beams extending in the measuring longitudinal axis Y are employed for controlling the Y axial position of the wafer table 18. Hence, if the length of the moving mirror 24Y is longer than the diameter of the wafer W, no particular problems may arise because the position of the wafer table 18 can be managed or monitored over the entire scope of the exposure region of the optical projection system PL and of the alignment measurement region of the alignment sensor AS.

A description of a first reset function of the interferometer will now be made. In this embodiment, a control operation of the main control unit 28 will be described by focusing on the first reset function of the interferometer.

The first reset function of the main control unit 28 is the function of aligning the wafer table 18 with a predetermined reset position and resetting one of the interferometers 26Xe and 26Xa in the respective measuring longitudinal axes Xe and Xa with the predetermined reset position on the basis of the measured values of the interferometer 26Y in the measuring longitudinal axis Y and one of the interferometers 26Xe and 26Xa, if the measuring longitudinal beams of the other of the interferometers 26Xe and 26Xa would run out and the involved interferometer would become in an unmeasurable state while the wafer table 18 has been moving in the XY-plane. The measuring beams emitting from the interferometer 26Y is so disposed as to be always emitted without being cut.

Figure 5A:
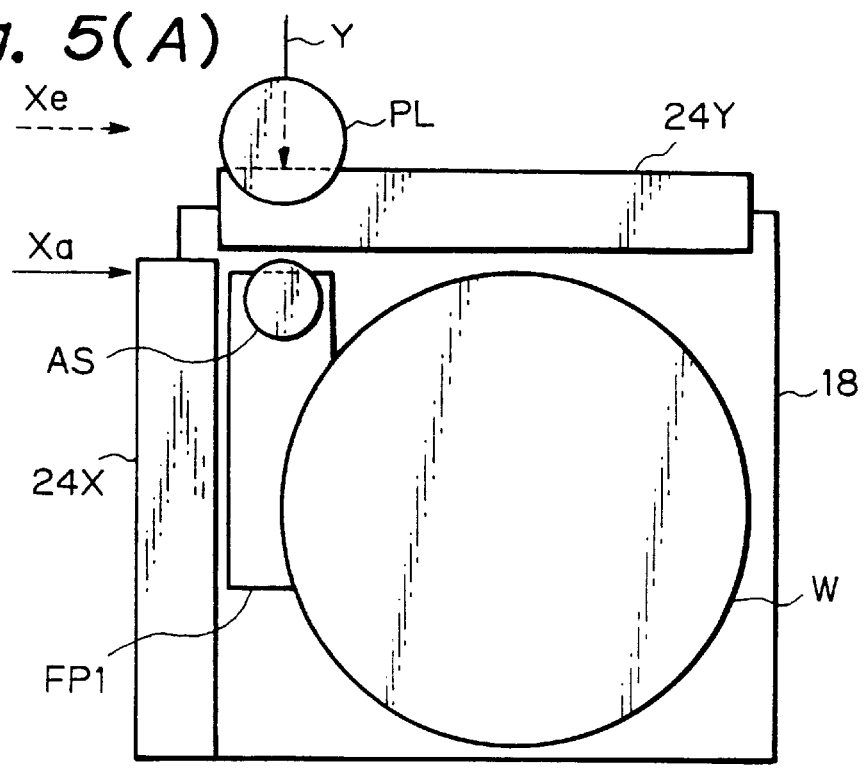
FIG. 5A is a view showing the state in which the wafer table is located in the position in which to change wafers and FIG. 5B is a view showing the state in which the wafer table is located in the position in which to reset the interferometer.
Figure 5B:
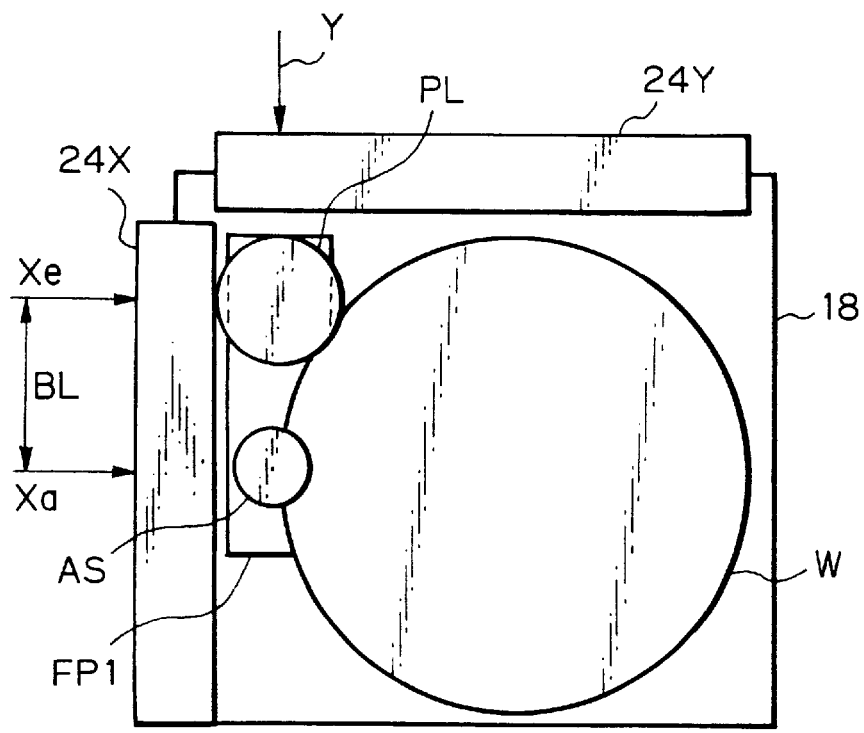
Figure 6A:
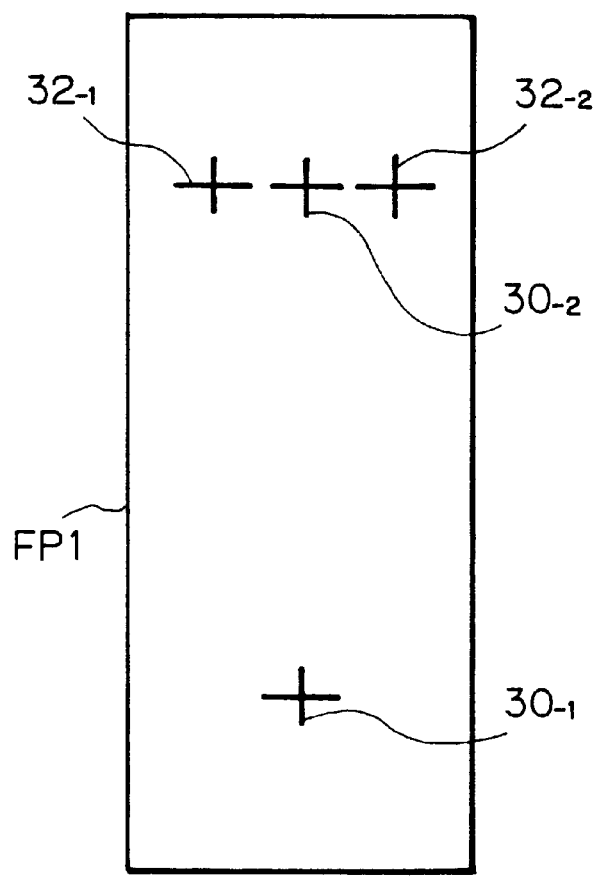
FIG. 6A is in which the greater FM is used and FIG. 6B is in which the smaller one is used.

On the upper surface of the wafer table 18 is provided the reference plate FP so as for its upper surface to become on a level as substantially high as with the upper surface of the wafer W, as described hereinabove. As the reference plate FP, there may be herein employed a reference plate FP1 as called a great FM, as shown in FIGS. 5A and 5B and as disclosed in U.S. Pat. No. 5,243,195. Further, on the reference plate FP1 are provided marks 30-1 and 30-1 for the alignment sensor as first reference marks, as shown in FIG. 6A, which are formed apart longitudinally at a predetermined interval in the lengthwise middle portion thereof. This interval is so set as to correspond to the designed value of the distance BL between the projection center of the optical projection system PL and the detection center of the alignment sensor AS. Further, as a pair of second reference marks, marks 32-1 and 32-2 for the reticle microscopes are formed symmetrically on the left and right sides of the first reference mark 30-2. In other words, the reference marks 30-1 and 30-2 and the reference marks 32-1 and 32-2 on the reference plate FP1 are each formed in a predetermined spatial relationship.

With the arrangements as described hereinabove, if the wafer table 18 is located in the position, for example, as indicated in FIG. 5A, in the state that exchange for wafers has been finished, the situation exists in which the measuring longitudinal beams in the measuring longitudinal axis Xe are cut, on the one hand, while the measuring longitudinal beams extending in the measuring longitudinal axis Y are kept turned on and the measuring longitudinal beams in the measuring longitudinal axis Xa are not cut, on the other. Therefore, in this state, the values measured by the interferometers 26Y and 26Xa are fed to the main control unit 28 and the main control unit 28 can recognize the position of the XY axially two-dimensional coordinates of the wafer table 18 at this point on the basis of the values measured by the interferometers 26Y and 26Xa. Further, on the basis of recognition of the Y-coordinate, the main control unit 28 can also recognize with high precision that the measuring longitudinal beams in the measuring longitudinal axis Xe is cut. It is to be noted herein, however, that at this point the interferometer 26Xa is reset as will be described hereinafter and that the wafer table 18 is managed by a (Xa, Y) coordinates system.

In this state, the alignment measurement (hereinafter referred to sometimes as "EGA measurements") is effected, as disclosed in U.S. Pat. No. 4,780,617, in which the main control unit 28 measures the position of the mark (alignment mark) for detecting the position of a particular sample shot area predetermined out of the plural shot areas on the wafer W on the (Xa, Y) coordinates system on the basis of the output of the alignment sensor AS by moving the wafer table 18 integrally with the XY-stage 20 one after another by the drive system 22 while monitoring the values measured by the interferometers 26Y and 26Xa. Thereafter, data on the entire sequence of the plural shot areas on the wafer is computed by effecting a statistical operation using the position of the wafer mark of each sample shot area measured in the manner as described hereinabove and the data on the sequence of the designed shot areas in accordance with the least square method as disclosed, for example, in U.S. Pat. No. 4,780,617 (Japanese Patent Unexamined Publication No. 61-44,429). It is provided, however, that the position of the first reference mark 30-1 is measured on the coordinates (Xa, Y) system by detecting the reference mark 30-1 with the alignment sensor AS when resetting the interferometer 26Xa prior to the alignment measurement and the calculation results are converted into data based on the first reference mark 30-1 on the reference plate FP1.

After the alignment measurement has been finished, the sequence of the shot areas is processed by exposure. In this state, it is assumed that the beams via the interferometer 26Xe is cut. This processing will now be described in more detail.

In this processing, the main control unit 28 aligns the wafer table 18 with the position (the reset position) in which the preset reference mark 30-1 on the reference plate FP1 is located within the detection region of the alignment sensor AS while monitoring the values measured by the interferometers 26Y and 26Xa. In the state that the wafer table 18 is aligned with the reset position, as shown in FIG. 5B, the measuring longitudinal beams in the measuring longitudinal axis Xe strikes the X-axially moving mirror 24X, and the second reference marks 32-1 and 32-2 and the first reference mark 30-2 on the reference plate FP1 are located within the projection region of the optical projection system PL. This can occur because the distance BL between the measuring longitudinal axis Xe and the measuring longitudinal axis Xa is designed so as to become equal to the distance between the first reference marks 30-1 and 30-2, as described hereinabove.

In this state, the main control unit 28 can simultaneously monitor an image of each of the second reference marks 32-1 and 32-2 on the reference plate FP1 and each of the reticle marks on the reticle R corresponding to the respective second reference marks, by using the reticle alignment microscopes 52A and 52B, thereby detecting a deviation of the position of each of the second reference marks 32-1 and 32-2 from the position of each of the reticle marks corresponding to the marks, on the basis of the detection signals of the reticle alignment microscopes 52A and 52B. More specifically, the interferometer 26Xe in the measuring longitudinal axis Xe is reset at the same time as the spatial relationship of the positions of the second reference marks 32-1 and 32-2 of the reference plate FP1 with the position of the projection center of the optical projection system PL can be detected. In this case, the projection center of the optical projection system PL coincides substantially with the projection center of the pattern image of the reticle R. The interferometer 26Xe is reset when the position of the wafer table 18 is detected using the alignment microscopes 52A and 52B and the second reference marks 32-1 and 32-2 on the reference plate FP1 in the manner as described hereinabove. In other words, the interferometer 26Xe is reset when the position of the wafer table 18 with respect to the projection center of the optical projection system PL is detected. It can be noted herein that, although the resetting is usually effected by setting a count value of a counter for counting the value measured by the interferometer 26Xe to zero, it is also possible to set the initial count to any optional numeral other than zero.

The operations as described hereinabove can manage the position of the wafer table 18 on the coordinates (Xe, Y) system.

Moreover, the main control unit 28 can effect the detection of the position of the first reference mark 30-1, that is, the detection of the spatial relationship of the position of the first reference mark 30-1 relative to the position of the detection center (the index center) of the alignment sensor AS, by the alignment sensor AS, in accompaniment with the detection of the spatial relationship of the positions of the respective second reference marks 32-1 and 32-2 of the reference plate FP1 with the position of the projection center of the optical projection system PL by the reticle alignment microscopes 52A and 52B. This allows an accurate measurement of the distance between the projection center of the pattern image of the reticle by the optical projection system PL (i.e. the projection center of the optical projection system PL) and the detection center of the alignment sensor AS, that is, the baseline amount, immediately after the alignment, thereby ensuring stability in the baseline that is of the most significance to the off-axis system as described hereinabove. Further, an influence of disturbance of air upon the interferometers can be avoided because the measurement of the baseline can be effected in the state in which the wafer table 18 is stayed still. Moreover, the angle of rotation of the reticle R can also be detected on the basis of the results of the simultaneous detection of the reference marks on the reference plate FP1 by the reticle alignment microscopes 52A and 52B as well as by the alignment sensor AS.

It is to be noted herein that the first reference mark 30-2 on the reference plate FP1 is disposed for the purpose to correct an error of rotation of the reference plate FP1 at the time of measurement of the baseline, if it is caused to occur, for example, due to an error of mounting of the reference plate FP1 on the wafer table 18 or an error of manufacturing. More specifically, as described hereinabove, the main control unit 28 aligns the first reference mark 30-2 within the detection region of the alignment sensor AS by moving the wafer table 18 in the +Y-axial direction after the measurement of the baseline has been finished, and the position of the mark 30-2 is measured on the basis of the detection signals of the alignment sensor AS. When this mark is to be measured, it is requisite that the measuring longitudinal axis Xe does not deviate from the mirror. If it is found as a result of measurement by the alignment sensor AS that the X-coordinate of the first reference mark 30-1 is different from that of the first reference mark 30-2, although the values of the measuring longitudinal axes Xa and Xe for effecting this measurement should not vary, when the wafer table 18 is being moved for effecting the measurement, an error of rotation of the reference plate FP1 is given on the basis of the difference between the X-coordinates of the marks 30-1 and 30-2, whereby the measured values of the baseline and the like can be corrected by that error portion.

Further, it is possible to correct the rotation of the reticle by the rotational error portion given as a result of the simultaneous detection of the reference marks on the reference plate FP1. However, as an angle of rotation or a magnification of each shot area or an error of an angle of intersection at a right angle can be found, if a so-called in-shot, multi-point EGA measurement is effected in a manner as disclosed in U.S. patent application Ser. No. 08/569,400 (for example, as disclosed in Japanese Patent Unexamined Publication No. 6-275,496), which is so designed as to measure two or more points within the identical shot area upon the EGA measurement as described hereinabove, it is further possible to make a correction by rotating the reticle R integrally with the reticle stage RST in accordance with the result of the above-mentioned EGA measurement or to adjust a magnification of the optical projection system PL by a magnification correction mechanism (not shown). As such a magnification correction mechanism to be used herein, there may be employed, for example, a mechanism for driving a particular lens element constituting the optical projection system PL in upward and downward directions, as disclosed in U.S. Pat. No. 5,117,255, or a mechanism for adjusting an inner pressure within an airtight sealing chamber interposed between particular lens elements.

Furthermore, the main control unit 28 exposes the pattern of the reticle onto the wafer W one after another in a step-and-repeat system while opening and closing a shutter of the optical illumination system, after each of the shot area on the wafer W is aligned with the exposure position while monitoring the values measured by the interferometers 26Y and 26Xe on the basis of the result of measurement of the deviation of the positions of the marks, the data on the sequence of the shot areas previously calculated on the basis of the first reference mark 30-1, and the baseline amount (the spatial relationship of the position of the first reference mark 30-1 relative to the second reference marks 32-1 and 32-2.

After the exposure of the reticle pattern to all the shot areas on the wafer W have been finished, the wafer table 18 is returned to the position in which to exchange for wafers, as shown in FIG. 5A. Before the return of the wafer table to that position, the interferometer 26Xa is reset in a manner as will be described hereinafter.

In this case, the measuring longitudinal beams in the measuring longitudinal axis Xa may deviate from the moving mirror 24X during the exposure onto the wafer W. On the other hand, however, the position of the wafer table 18 is managed by the coordinates (Xe, Y) system during the exposure so that the wafer table 18 is aligned with the predetermined reset position by the main control unit 28 so as to be located in the position in which the spatial relationship of the preset positions of the second reference marks 32-1 and 32-2 on the reference plate FP1 with the projection center of the optical projection system PL within its projection region can be detected, while monitoring the values measured by the interferometers 26Y and 26Xe. It is to be noted herein that this projection center of the optical projection system PL coincides substantially with the projection enter of the pattern image of the reticle R. In the state that the wafer table 18 is aligned with the predetermined reset position, as shown in FIG. 5B, the measuring longitudinal beams in the measuring longitudinal axis Xa strike the moving mirror 24X and the first reference mark 30-1 on the reference plate FP1 is located within the detection region of the alignment sensor AS. This is allowed to occur because the mutual distance BL between the measuring longitudinal axes Xe and Xa is designed so as to be equal to the distance between the first reference marks 30-1 and 30-2 in the manner as described hereinabove.

By using the alignment sensor AS in this state, the main control unit 28 detects the position of the first reference mark 30-1 on the reference plate FP1 as well as resets the interfero-meter 26Xa. As described hereinabove, the interferometer 26Xa is reset when the position of the wafer table 18 with respect to the detection center of the alignment sensor AS is detected. Further, the position of the reference mark 30-1 of the reference plate FP1 is measured on the coordinates (Xa, Y) system.

This arrangement of the main control unit 28 allows a management of the wafer table 18 by the coordinates (Xa, Y) system. Then, the exchanges for the wafers and the alignment measurement are carried out on the coordinates (Xa, Y) system of the interferometer 26Xa.

Then, a description will be made of a second reset function of the interferometer. In this embodiment, a control operation by the main control unit 28 will be described by focusing on the second reset function of the interferometer.

The second reset function of the main control unit 28 is the function of aligning the wafer table 18 so as to allow each of the reference marks of the wafer table 18 to be located in the respective reset positions on the basis of the value measured by the interferometer 26Y in the measuring longitudinal axis Y and resetting the corresponding interferometer in the measuring longitudinal axis at the reset position, when either or both of the measuring longitudinal beams in the measuring longitudinal axes Xe and Xa is or are cut during the migration of the wafer table 18 on the XY-plane and the corresponding interferometer or interferometers is or are brought into an unmeasurable state. It is to be noted herein that the measuring longitudinal beams Y of the interferometer 26Y are so arranged as to be always emitted without being cut.

Figure 6B:
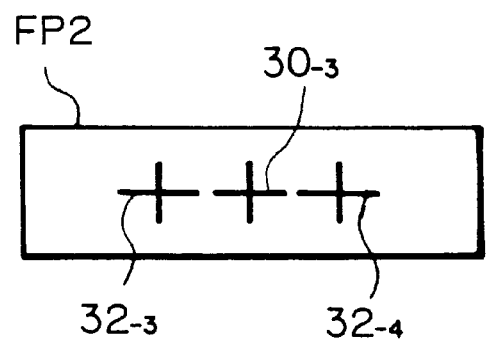

On the upper plane of the wafer table 18 is provided the reference plate FP so as to set its upper surface on a level as substantially high as the upper surface of the wafer W in the manner as described hereinabove, as disclosed in U.S. Pat. No. 5,003,342. As the reference plate FP, there may be herein employed a reference plate FP2 called a small FM, as shown in FIGS. 7A and 7B. On the reference plate FP2 is provided a reference mark 30-3 for the alignment sensor at its middle portion, as shown in FIG. 6B, and a pair of reference marks 32-3 and 32-4 are provided symmetrically on the longitudinally extending, left and right sides of the reference mark 30-3. The reference mark 30-3 and the reference marks 32-3 and 32-4 on the reference plate FP2 are disposed in a predetermined spatial relationship with respect to each other.

In the state where exchange for the wafers have been finished, the situation occurs where the measuring longitudinal beams in the measuring longitudinal axis Y are not cut and the measuring longitudinal beams in the measuring longitudinal axis Xa are not cut, although the measuring longitudinal beams in the measuring longitudinal axis Xe are cut. Therefore, the values measured by the interferometers 26Y and 26Xa are fed to the main control unit 28 so that the main control unit 28 can recognize the position of the XY axial, two-dimensional coordinates of the wafer table 18 on the basis of the values measured by the inter-ferometers 26Y and 26Xa and it can further recognize the situation with high precision on the basis of the recognition of the Y-coordinate that the measuring longitudinal beams in the measuring longitudinal axis Xe are cut. It is further to be noted herein that the interferometer 26Xa is reset in a manner as will be described hereinafter and that the wafer table 18 is managed by a (Xa, Y) coordinates system.

In this state, the alignment measurement is effected as disclosed in U.S. Pat. No. 4,780,617, in which the main control unit 28 measures the position of the mark (alignment mark) for detecting the position of the particular sample shot area predetermined among the plural shot areas on the wafer W on the (Xa, Y) coordinates system on the basis of the output of the alignment sensor AS by moving the wafer table 18 integrally with the XY-stage 20 via the drive system 22 while monitoring the values measured by the interferometers 26Y and 26Xa. Thereafter, data on the entire sequence of the plural shot areas on the wafer is computed by effecting a statistical operation using the position of the wafer mark of each sample shot area measured in the manner as described hereinabove and using the data on the sequence of the designed shot areas in accordance with the least square method as disclosed in U.S. Pat. No. 4,780,617 (for example, in Japanese Patent Unexamined Publication No. 61-44,429). It is desired, however, that the calculation results are converted into data based on the reference mark 30-3 on the reference plate FP2. This can give a spatial relationship between the position of each of the shot areas with respect to the position of the reference mark 30-3, as indicated by the arrow in FIG. 8. It is further noted herein that the position of the reference mark 30-3 is measured on the (Xa, Y) coordinates system at the time of resetting the interferometer 26Xa prior to the alignment measurement by detecting the reference mark 30-3 by the alignment sensor AS, in a manner as will be described hereinafter.

After the alignment measurement has been finished, the operation is shifted to an sequence of the exposure processes. It is assumed herein that in this state the interferometer beams of the interferometer 26Xe is cut.

In the exposure processing, the main control unit 28 drives the wafer table 18 in the −X-axial direction or in the +X-axial direction, as shown in FIG. 2, so as to make the Xa coordinate to become zero while monitoring the values measured by the interferometer 26Xa. It is to be noted herein that the direction in this case may be determined in accordance with the setting of the position in which to finish the alignment measurement. This can lead to the state in which the central reference mark 30-3 of the reference plate FP2 coincides substantially with the measuring longitudinal axis Y. Thereafter, the main control unit 28 aligns the wafer table 18 with the predetermined position, i.e. the reset position of the interferometer 26Xe, so as to locate the reference plate FP2 in the position immediately under the optical projection system PL, that is, in the position in which the position of the reference marks 32-3 and 32-4 relative to the projection center of the optical projection system PL can be detected, by moving the wafer table 18 in the +Y-axial direction while monitoring the values measured by the interferometer 26Y in accordance with the preset Y-coordinate value (e.g. zero) of the optical projection system PL. The state at this time is indicated in FIG. 7B.

In this state, the main control unit 28 can simultaneously monitor an image of each of the reference marks 32-3 and 32-4 on the reference plate FP2 and the reticle marks on the reticle R corresponding to the second reference marks, using the reticle alignment microscopes 52A and 52B, thereby detecting a deviation of the position of each of the reference marks 32-3 and 32-4 from the position of the reticle mark corresponding to each of the marks, on the basis of the detection signals of the reticle alignment microscopes 52A and 52B. More specifically, the interferometer 26Xe in the measuring longitudinal axis Xe is reset at the same time as the spatial relationship of the position of each of the reference marks 32-3 and 32-4 of the reference plate FP2 with the position of the projection center of the optical projection system PL can be detected. In this case, the projection center of the optical projection system PL corresponds substantially to the projection center of the pattern image of the reticle R. As described hereinabove, the interferometer 26Xe is reset when the position of the wafer table 18 is detected using the alignment microscopes 52A and 52B and the second reference marks 32-3 and 32-4 on the reference plate FP2. In other words, the interferometer 26Xe is reset in such a state that the position of the wafer table 18 with respect to the projection center of the optical projection system PL is detected. It can be noted herein that, although the resetting is usually effected by setting a count value of a counter for counting the values measured by the interferometer 26Xe to zero, it is also possible to set the initial count to any optional numeral other than zero.

Thus, the position of the wafer table 20 can be managed on the (Xe, Y) coordinates system.

In the case of FIG. 7B, the interferometer beams of the interferometer 26Xa are not cut in the reset position of the interferometer 26Xe so that it is also possible to move the interferometer 26Xe along a straight line on the basis of the values measured by the interferometers 26Xa and 26Y to its reset position from the position in which the alignment measurement of the wafer table 18 has been finished.

For instance, however, where the measuring longitudinal axes Xe and Xa are apart to a more extent, the interferometer beams in the measuring longitudinal axis Xa may be cut during the movement of the wafer table 18 so that the position of the wafer table 18 cannot be controlled. At this time, the interferometer beams in the measuring longitudinal axis Xe are also cut. Hence, if the wafer table 18 is allowed to move in the +Y-axial direction after it has once been moved in the −X-axial or +X-axial direction in the manner as described hereinabove, the interferometer 26Xe can be reset in the predetermined reset position, that is, in the position in which the reference plate FP2 is located in the position immediately below the optical projection system PL, without causing an occurrence of the state in which the position control cannot be conducted.

Therefore, the second reset function of the interferometer allows the length of the moving mirror 24X to be set as substantially long as the diameter of the wafer W, even if whatever long the distance between the measuring longitudinal axes Xe and Xa would be, that is, the baseline amount BL would be.

During movement of the wafer table 18 in the Y-axial direction when the measuring longitudinal beams in both of the measuring longitudinal axes Xa and Xe are cut, it is preferred that the position of the X-stage constituting the XY-stage 20 is set to fail to move. Hence, it is preferred that the servo control of the position in the X-axial direction be conducted by using an alternative sensor or by locking the X-stage itself, while the X axial interferometer cannot be employed.

Moreover, the main control unit 28 can effect the exposure of the reticle pattern onto the wafer one after another in the step and-repeat system by opening and closing a shutter of the optical illumination system by aligning each shot area on the wafer W with the exposure position, while monitoring the values measured by the interferometers 26Y and 26Xe on the basis of the measured result of the deviation of the position and the data of the sequence of the shot areas (FIG. 8) previously computed on the basis of the reference mark 30-3, and the spatial relationship of the position of the reference mark 30-3 with the positions of the reference marks 32-3 and 32-4.

When the exposure of the reticle pattern to all the shot areas on the wafer W has been finished, the wafer table 18 is returned to the position in which to exchange wafers. Before return of the wafer table to the exchange position, the interferometer 26Xa is reset in a manner as will be described hereinafter.

In this case, although the situation may occur that the measuring longitudinal beams in the measuring longitudinal axis Xa are deviated from the moving mirror 24X and they do not strike it during the exposure onto the wafer W, the wafer table 18 is managed by the (Xe, Y) coordinates system during exposure so that the main control unit 28 moves the wafer table 18 to the position in which the Xe-coordinate becomes zero after the exposure has been finished, while monitoring the values measured by the interferometer 26Xe. In other words, the wafer table 18 is moved in the X-axial direction until the measured value of the interferometer 26Xe reaches the Xe-coordinate value at the time when the interferometer 26Xe is reset. This can lead to the state in which the reference mark 30-3 of the reference plate FP2 coincides substantially with the measuring longitudinal axis Y. There-after, the main control unit 28 moves the wafer table 18 in the −Y-axial direction while monitoring the values measured by the interferometer 26Y in accordance with the preset Y coordinate value of the detection center of the alignment sensor AS and then aligns the wafer table 18 with the predetermined position (i.e. the reset position of the interferometer 26Xa) in which the reference mark 32-3 of the reference plate FP2 is located within the detection region of the alignment sensor AS. This state is indicated in FIG. 7A.

In the state where the wafer table 18 is aligned with the reset position, the measuring longitudinal beams extending in the measuring longitudinal axis Xa strike the X-axially moving mirror 24X, as shown in FIG. 7A, and the first reference mark 30-3 of the reference plate FP2 is located within the detection region of the alignment sensor AS.

Further, in this state, the main control unit 28 detects the position of the reference mark 30-3 on the reference plate FP2 using the alignment sensor AS and simultaneously resets the interferometer 26Xa. As described hereinabove, the interferometer 26Xa is reset when the position of the wafer table 18 has been detected with the alignment sensor AS and the reference mark 30-3 of the reference plate FP2. In other words, the interferometer 26Xa is reset when the position of the wafer table 18 has been detected with respect to the detection center of the alignment sensor AS. Further, the position of the reference mark 30-3 of the reference plate FP2 is measured on the coordinates (Xa, Y) system.

This enables the wafer table 18 to be managed by the (Xa, Y) coordinates system. Further, the wafers are exchanged and the alignment measurement are carried out on the coordinates (Xa, Y) system of the interferometer 26Xa.

With the arrangements as described hereinabove, the projection exposure apparatus in the embodiments according to the present invention can use the moving mirrors 24X and 24Y each having its length Lm that is defined to be shorter than Dw+2BL, where Dw is the diameter of the wafer W and BL is the baseline amount and to be slightly longer than the diameter Dw of the wafer W. On the other hand, a conventional exposure apparatus uses moving mirrors each having a length Lm that is longer than Dw+2BL. Therefore, the projection exposure apparatus according to the present invention can make the wafer table 18 with the moving mirror mounted thereon and the XY-stage 20 with the wafer table loaded thereon more compact in size and lighter in weight, as compared with the such conventional exposure apparatus. Further, this can gain improvements in performance of controlling the position of the wafer table 18 and the XY-stage 20. Moreover, as a matter of course, the projection exposure apparatus according to the present invention can be made more compact in size as a whole.

It can be understood herein that, in order to conduct the alignment measurement by the alignment sensor AS or effect the exposure by the optical projection system PL, theoretically, the length Lm of the moving mirror is long enough if it is equal in length to the diameter Dw of the wafer; however, as a practical matter, it is required that the length Lm of the moving mirror is set to be slightly longer than the diameter Dw of the wafer because clearance should be ensured for smoothness on the both end portions of the reflecting plane of the moving mirror and for the diameter of the beams.

Further, in the embodiments of the present invention as described hereinabove, the main control unit 28 is provided with the first and second reset functions which reset the interferometers at timings between alignment and exposure, so that each of operations for measuring the alignment mark and for conducting the exposure can be carried out without any problem and difficulty, even if the wafer table 18 is in a generally square shape greater than the diameter of the wafer.

It is particularly noted herein that, as the baseline can be measured immediately after the alignment measurement by the operation of resetting the interferometers by means of the main control unit 28 using the reference plate FP1 as a reference plate, which is called a large FM, the projection exposure apparatus according to the present invention can ensure stability of the baseline amount that is of the most significance to the alignment sensor of an off-axis system. Moreover, as the measurement of the baseline can be carried out in a static state of the wafer table 18, the measurement thereof can be conducted with high precision without undergoing an error in measurement by the interferometers to be otherwise caused by air turbulence or for other reasons.

On the other hand, it is noted herein that, as the main control unit 28 further uses the reference plate FP2 as a reference plate, which is called a small FM, and it is operated to reset the interferometers, the size of the wafer table 18 can be set to be as small as the diameter of the wafer W, regardless of the magnitude of the baseline amount BL.

Therefore, the present invention can readily make the N.A. of the optical projection system PL higher and the field thereof greater in size in order to improve resolving power, while sustaining the size of the wafer table 18 constant.

It is to be understood that the present invention is not restricted in any respect to those embodiments as described hereinabove and that it encompasses any modifications and variations within the spirit and scope of the present invention. For example, it is readily understood that the following embodiments are likewise encompassed within the present invention.

As disclosed in U.S. Pat. No. 5,151,749, a yawing interferometer having measuring axes Y1 and Y2 as shown in FIG. 9 may also be employed in place of the Y-axial interferometer 26Y of FIG. 2. The yawing interferometer can readily give a yawing amount of the wafer table 18 by dividing a difference between the measured values of the Y1-axis and the Y2-axis by a distance Yy between the axes Y1 and Y2, Further, it allows a measurement of the Y-coordinate of the wafer table 18, which is equivalent of the interferometer in a measuring longitudinal axis Ya corresponding to the Y-axial interferometer 26Y of FIG. 2, on the basis of an average of the measured values of the Y1-axis and the Y2-axis. Likewise, the yawing interferometer may be mounted on the X-axial side; however, in this case, the yawing interferometer should be mounted on the both side for each of the measuring longitudinal axes Xa and Xe so that the configuration may become complex. Therefore, in the case of FIG. 9, the yawing interferometer is mounted only on the Y-axis side on the condition that the degree of intersecting the moving mirror 24Y with the moving mirror 24Y does not vary. Further, it is also possible to use the yawing interferometers on both of the X- and Y-axes, if the angle of intersecting the moving mirror 24Y with the moving mirror 24Y at a right angle would vary, or to measure a variation by storing the spatial relation-ship among the measuring longitudinal axes Xa, Xe and Y when none of their respective measuring longitudinal beams are still cut.

In the embodiments as described hereinabove, the case is described in which the interferometers are reset using the reference plate FP1 or FP2 at timings when the operation is shifted to the exposure operation from the alignment measurement. It is to be noted herein that the interferometers may also be reset simply by defining a certain reference point on the wafer table 18 acting as the substrate stage and aligning the wafer table 18 with a position in which the certain reference point is located within a predetermined reset position. Therefore, as the such certain reference point, there may be defined one point on the wafer W, for example, an alignment mark attached to a certain shot area.

Further, in the embodiments as described hereinabove, the case is described in which the moving mirrors 24X and 24Y are fixed on the wafer table 18. It is also possible to use a wafer table as the moving mirror by mirror-finishing the side surface of the wafer table. In such a case, the rigidity of the wafer table 18 can be increased. In order to make the wafer table compact in size as in the embodiments as described hereinabove, the wafer table with its side surface mirror-finished can be readily employed as the moving mirror.

Furthermore, in the embodiments as described hereinabove, a description is made of the case in which the coordinates of the sequence of the shot areas on the wafer W are predetermined by the so-called EGA measurement and the stepping of the wafer table is effected on the basis of the coordinates of the sequence thereof upon exposure. It is also possible to alternately reset the interferometers at the reset positions, as shown in FIGS. 7A and 7B, when the small FM (the reference plate FP2) is employed in the case where the alignment measurement of the alignment mark and the exposure are alternately carried out for each shot area. In this case, too, it is possible to measure the spatial relationship of the position of the reference mark 30-3 with each alignment mark upon alignment in a similar manner as with that indicated by the arrow in FIG. 8, followed by superimposition of the pattern image of the reticle upon the wafer upon exposure on the basis of the result of measurement.

Moreover, in the embodiments as described hereinabove, the case is described in which the main control unit is provided with the reset function for resetting the interferometers. To the projection exposure apparatus according to the present invention, in addition to the reset function as described hereinabove, there may be applied, for example, a device for always managing the position of the substrate stage using an identical interferometer or a device for managing the position of the wafer table using different interferometers upon alignment and upon exposure.

In addition, in the embodiments as described hereinabove, a description is made of the case in which the present invention is applied to the projection exposure apparatus in the step-and-repeat system. It is further to be noted that the scope of the application of the present invention is not restricted to the case and the present invention can also be appropriately applied to, for example, a projection exposure apparatus of a step-and-scan system. In the case of the projection exposure apparatus of the step-and-scan system, it is also possible to correct an error of the angle of intersection at a right angle by varying an angle of scanning the reticle stage relative to the wafer stage, as disclosed in U.S. patent application Ser. No. 08/533,923 filed Sep. 26, 1995 (for example, Japanese Patent Unexamined Publication No. 7-57,991), when such an error of the angle of intersection or the like is found by the in-shot, multi-point EGA as described hereinabove.

Furthermore, the present invention can be applied to an electron beam exposure apparatus or an X-ray exposure apparatus as well as to the optical exposure apparatus such as the stepper. Even when the present invention is applied to such an exposure apparatus, the present invention can enjoy the various merits by making the substrate stage more compact in size, such as improvements in controllability of the stages, cost reductions of a clean room by reducing an area for installation of the apparatus (a so-called foot print), and the like.

What is claimed is:

1. A projection exposure method for projecting a pattern of a mask onto a substrate through a projection system, comprising:
   detecting a mark on said substrate and a reference mark on a substrate stage for loading said substrate without using said projection system;
   detecting a position of said substrate stage by using a first position measuring system when the mark on said substrate is detected without using said projection system;
   then detecting said reference mark through said projection system; and
   detecting a position of said substrate stage by using a second position measuring system different from said first position measuring system when the pattern of said mask is projected onto said substrate.

2. The projection exposure method as claimed in claim 1, wherein the step of detecting said mark on said substrate and said reference mark without using said projection system uses a mark detection system having a light axis different from said projection system.

3. The projection exposure method as claimed in claim 1, wherein the step of detecting said mark on said substrate and said reference mark without using said projection system is carried out in such a manner that the step of detecting said reference mark is carried out and then the step of detecting said mark on said substrate is carried out.

4. The projection exposure method as claimed in claim 2, wherein, after said reference mark and said mark on said substrate have been detected by said mark detection system, said substrate stage is moved to locate said reference mark in a projection region of said projection system.

5. The projection exposure method as claimed in claim 2, wherein the step of detecting said reference mark and said mark on said substrate by said mark detection system is to detect a relative spatial relationship between said reference mark and plural shot areas on said substrate.

6. The projection exposure method as claimed in claim 5, wherein said mark on said substrate is formed in plural positions on said substrate in accordance with said plural shot areas.

7. The projection exposure method as claimed in claim 6, wherein said substrate stage is moved on the basis of a result of detection obtained in the step of detecting said reference mark through said projection system and on the basis of the relative spatial relationship between said reference mark and said plural shot areas on said substrate, whereby each of said plural shot areas is exposed.

8. The projection exposure method as claimed in claim 2, wherein information on an arrangement of plural shot areas on the substrate is detected by detecting said mark on said substrate by said mark detection system.

9. The projection exposure method as claimed in claim 8, wherein said mark on said substrate is formed in plural positions on said substrate in accordance with said plural shot areas.

10. The projection exposure method as claimed in claim 9, wherein said reference mark is formed in plural positions for one of said plural shot areas.

11. The projection exposure method as claimed in claim 2, wherein information on a position of projection of the pattern of said mask by said projection system is obtained by detecting said reference mark through said projection system.

12. The projection exposure method as claimed in claim 1, wherein the step of detecting said reference mark through said projection system contains detecting said reference mark and a mark formed on said mask through said projection system and detecting a relative spatial relationship between said reference mark and the mark formed on said mask.

13. The projection exposure method as claimed in claim 12, further comprising detecting information concerning a distance between a detection reference point of said mark detection system and a projection reference point of the pattern of said mask by said projection system on the basis of a result of detection of said reference mark obtained by said mark detection system and on the basis of the relative spatial relationship between the mark formed on said mask and said reference mark.

14. The projection exposure method as claimed in claim 1, wherein each of said first position measuring system and said second position measuring system comprises an interferometer.

15. The projection exposure method as claimed in claim 1, wherein a detection value of said first position measuring system is reset when said reference mark has been detected without using said projection system.

16. The projection exposure method as claimed in claim 15, wherein a position of said substrate stage is arranged so as to deviate from a measuring area of said first position measuring system during a process of exposing plural shot areas on said substrate.

17. The projection exposure method as claimed in claim 1, wherein a detection value of said second position measuring system is reset when said reference mark has been detected through said projection system.

18. The projection exposure method as claimed in claim 17, wherein a position of said substrate stage is arranged so as to deviate from a measuring area of said second position measuring system when said substrate is exchanged or when the mark on said substrate is detected without using said projection system.

19. The projection exposure method as claimed in claim 1, wherein said reference mark comprises a first mark to be detected without using said projection system and a second mark to be detected through said projection system, which is disposed in a predetermined spatial relationship with said first mark.

20. The projection exposure method as claimed in claim 1, wherein said projection system is telecentric at both ends.

21. The projection exposure method as claimed in claim 1, further comprising moving said mask in accordance with a result of detection obtained when the mark on said substrate has been detected without using said projection system.

22. The projection exposure method as claimed in claim 21, wherein the step of moving said mask comprises detecting rotation of a shot area on said substrate in accordance with a result of detection obtained when the mark on said substrate has been detected without using said projection system, and rotating said mask in accordance with the rotation of said shot area on said substrate.

23. The projection exposure method as claimed in claim 1, further comprising moving said mask in accordance with a result of detection obtained when said reference mark has been detected through said projection system.

24. The projection exposure method as claimed in claim 23, wherein the step of moving said mask contains detecting an amount of rotation of said mask in accordance with a result of detection obtained when said reference mark has been detected through said projection system and a result of detection obtained when said reference mark has been detected without using said projection system and compensating for the rotation of said mask in accordance with said amount of the rotation of said mask.

25. The projection exposure method as claimed in claim 1, further comprising moving said substrate stage on the basis of the result of detection obtained in the step of detecting said mark on said substrate and said reference mark without using said projection system and the result of detection obtained in the step of detecting said reference mark through said projection system and projecting said pattern of said mask onto said substrate.

26. The projection exposure method as claimed in claim 1, wherein an image formation characteristic of said projection system is varied in accordance with the result of detection obtained when said mark on said substrate has been detected without using said projection system.

27. The projection exposure method as claimed in claim 26, wherein said image formation characteristic is a magnification of projection.

28. The projection exposure method as claimed in claim 1, wherein said reference mark is formed on the substrate.

29. The projection exposure method as claimed in claim 2, further comprising detecting an amount of yawing of said substrate stage by a yawing interferometer having a measuring axis parallel to a direction connecting a projection center of said projection system to a detection center of said mark detection system.

30. The projection exposure method as claimed in claim 4, further comprising moving said substrate stage on the basis of a result of detection obtained in the step for detecting said mark on said substrate and said reference mark without using said projection system and a result of detection obtained in the step of detecting said reference mark through said projection system and projecting the pattern of said mask onto said substrate.

31. The projection exposure method as claimed in claim 30, wherein said projection system is telecentric at both ends.

32. The projection exposure method as claimed in claim 31, wherein:
    said mark on said substrate is formed in plural positions in accordance with plural shot areas on said substrate; and
    the step of detecting said reference mark and said mark on said substrate by said mark detection system detects a relative spatial relationship between said reference mark and said plural shot areas on said substrate.

33. The projection exposure method as claimed in claim 32, wherein the step of detecting said reference mark through said projection system is to detect said reference mark and a mark formed on said mask through said projection system and to obtain information on a position of projection of the pattern of said mask by said projection system.

34. The projection exposure method as claimed in claim 33, further comprising rotating said mask in accordance with a result of detection obtained when the mark on said substrate has been detected without using said projection system or a result of detection obtained when said reference mark has been detected through said projection system.

35. The projection exposure method as claimed in claim 34, wherein an image formation characteristic of said projection system is varied in accordance with a result of detection obtained when the mark on said substrate has been detected without using said projection system.

36. The projection exposure method as claimed in claim 35, further comprising detecting an amount of yawing of said substrate stage by a yawing interferometer having a measuring axis parallel to a direction connecting a projection center of said projection system to a detection center of said mark detection system.

37. A projection exposure apparatus for projecting a pattern of a mask onto a substrate through a projection system, comprising:
    a substrate stage, disposed on an image plane side of the projection system, that loads said substrate;
    a reference mark disposed on said substrate stage;
    a first mark detection system that detects said reference mark and a mark formed on said substrate without using said projection system;
    a control system, connected to said substrate stage, that controls position of said substrate stage so as to locate said reference mark in a projection region of said projection system after said substrate stage has been moved so as to allow said first mark detection system to detect the mark on said substrate and said reference mark:
    a first position measuring system which is connected to said control system and disposed to detect a position of said substrate stage when the mark on said substrate is to be detected by said first mark detection system: and a second position measuring system different from said first position measuring system, which is connected to said control system and disposed to detect a position of said substrate stage when the pattern of said mask is to be projected onto said substrate.

38. The projection exposure apparatus as claimed in claim 37, further comprising a second mark detection system for detecting said reference mark through said projection system, which is connected to said control system.

39. The projection exposure apparatus as claimed in claim 37, wherein said control system is arranged to control a position of said substrate stage so as to detect the mark on said substrate after said reference mark has been detected by said first mark detection system.

40. The projection exposure apparatus as claimed in claim 37, wherein said first mark detection system is arranged so as to detect a relative spatial relationship between said reference mark and plural shot areas on said substrate by detecting said reference mark and the mark on said substrate.

41. The projection exposure apparatus as claimed in claim 40, wherein said mark on said substrate is formed in plural positions on said substrate in accordance with said plural shot areas.

42. The projection exposure apparatus as claimed in claim 41, wherein said control system is arranged to move said substrate stage on the basis of results of detection obtained by said first mark detection system and said second mark detection system and to expose said plural shot areas.

43. The projection exposure apparatus as claimed in claim 37, wherein said first mark detection system is arranged to detect information on an arrangement of plural shot areas on said substrate by detecting said mark on said substrate.

44. The projection exposure apparatus as claimed in claim 43, wherein said mark on said substrate is formed in plural positions on said substrate in accordance with said plural shot areas.

45. The projection exposure apparatus as claimed in claim 44, wherein said reference mark is formed in plural positions for one of said plural shot areas.

46. The projection exposure apparatus as claimed in claim 38, wherein said second mark detection system is arranged to obtain information on a position of projection of the pattern of said mask by said projection system by detecting said reference mark.

47. The projection exposure apparatus as claimed in claim 38, wherein said second mark detection system is arranged to detect said reference mark and a mark formed on said mask through said projection system and to detect a relative spatial relationship between said reference mark and the mark formed on said mask.

48. The projection exposure apparatus as claimed in claim 47, wherein said control system is arranged to detect information on a distance between a detection reference point of said first mark detection system and a projection reference point of the pattern of said mask by said projection system on the basis of the result of detection of said reference mark obtained by said first mark detection system and the result of detection of a relative spatial relationship between the mark formed on said mask and said reference mark obtained by said second mark detection system.

49. The projection exposure apparatus as claimed in claim 37, wherein said first and second position measuring systems comprise each an interferometer.

50. The projection exposure apparatus as claimed in claim 37, wherein said control system is arranged to reset a detection value detected by said first position measuring system when said reference mark has been detected by said first mark detection system.

51. The projection exposure apparatus as claimed in claim 50, wherein the position of said substrate stage is arranged so as to deviate from a measuring area of said first position measuring system during a process of exposing plural shot areas on said substrate.

52. The projection exposure apparatus as claimed in claim 37, wherein said control system is arranged to reset a detection value detected by said second position measuring system when said reference mark has been detected through said projection system.

53. The projection exposure apparatus as claimed in claim 52, wherein the position of said substrate stage is arranged so as to deviate from a measuring area of said second position measuring system when said substrate is exchanged or said mark on said substrate is detected by said first mark detection system.

54. The projection exposure apparatus as claimed in claim 38, wherein said reference mark comprises a first mark detected by said first mark detection system and a second mark detected by said second mark detection system, which is disposed so as to have a predetermined spatial relationship with said first mark.

55. The projection exposure apparatus as claimed in claim 54, wherein said second mark is disposed in a projection region of said projection system when said first mark is detected by said first mark detection system.

56. The projection exposure apparatus as claimed in claim 37, wherein said projection system is telecentric at both ends.

57. The projection exposure apparatus as claimed in claim 37, wherein said control system is arranged to move said mask in accordance with the result of detection obtained by said first mark detection system.

58. The projection exposure apparatus as claimed in claim 57, wherein said control system is arranged to detect the rotation of a shot area on said substrate in accordance with the result of detection obtained by said first mark detection system and to rotate said mask in accordance with the rotation thereof.

59. The projection exposure apparatus as claimed in claim 38, wherein said control system is arranged to move said mask in accordance with the result of detection obtained by said second mark detection system.

60. The projection exposure apparatus as claimed in claim 59, wherein said control system is arranged to detect an amount of rotation of said mask in accordance with the result of detection obtained by said first mark detection system and the result of detection obtained by said second mark detection system and to compensate for the rotation of said mask in accordance with the amount of rotation thereof.

61. The projection exposure apparatus as claimed in claim 37, wherein said control system is arranged to vary an image formation characteristic of said projection system in accordance with the result of detection obtained by said first mark detection system.

62. The projection exposure apparatus as claimed in claim 61, wherein said image formation characteristic comprises a magnification of projection.

63. The projection exposure apparatus as claimed in claim 37, further comprising a moving mirror for position detection disposed in said substrate stage;

wherein said reference mark is disposed in a position between said moving mirror and said substrate.

64. The projection exposure apparatus as claimed in claim 37, further comprising a yawing interferometer for detecting an amount of yawing of said substrate stage, which has a measuring axis parallel to a direction in which a projection center of said projection system is connected to a detection center of said mark detection system.

65. The projection exposure apparatus as claimed in claim 38, wherein said control system is arranged to move said substrate stage in accordance with the result of detection obtained by said first mark detection system and the result of detection obtained by said second mark detection system and to project the pattern of said mask onto said substrate.

66. The projection exposure apparatus as claimed in claim 65, wherein said projection system is telecentric at both ends.

67. The projection exposure apparatus as claimed in claim 66, wherein:
the mark on said substrate is formed in plural positions on said substrate in accordance with a plural shot areas; and
said first mark detection system is arranged to detect a relative spatial relationship between said reference mark and said plural shot areas on said substrate by detecting said reference mark and the mark on said substrate.

68. The projection exposure apparatus as claimed in claim 67, wherein said second mark detection system is arranged to detect said reference mark and a mark formed on said mask through said projection system and to obtain information on a position of projection of the pattern of said mask by said projection system.

69. The projection exposure apparatus as claimed in claim 68, wherein said control system is arranged to rotate said mask in accordance with the result of detection obtained by said first mark detection system or the result of detection obtained by said second mark detection system.

70. The projection exposure apparatus as claimed in claim 69, wherein said control system is arranged to vary an image formation characteristic of said projection system in accordance with the result of detection obtained by said first mark detection system.

71. The projection exposure apparatus as claimed in claim 70, further comprising a yawing interferometer for detecting an amount of yawing of said substrate stage, which has a measuring axis parallel to a direction in which a projection center of said projection system is connected to a detection center of said mark detection system.

72. A method for producing a projection exposure apparatus for projecting a pattern of a mask onto a substrate through a projection system, comprising:
providing a substrate stage, disposed on an image plane side of the projection system, that loads said substrate;
providing a reference mark disposed on said substrate stage;
providing a first mark detection system that detects said reference mark and a mark formed on said substrate without using said projection system;
providing a control system which is connected to said substrate stage and disposed to control a position of said substrate stage so as to locate said reference mark in a projection region of said projection system after said substrate stage has been moved to allow said first mark detection system to detect the mark on said substrate and said reference mark;
providing a first position measuring system which is connected to said control system and disposed to detect a position of said substrate stage when the mark on said substrate is to be detected by said first mark detection system; and
providing a second position measuring system different from said first position measuring system, which is connected to said control system and disposed to detect a position of said substrate stage when the pattern of said mask is to be projected onto said substrate.

73. The method as claimed in claim 72, further comprising providing a second mark detection system which is connected to said control system and arranged to detect said reference mark through said projection system.

74. The method as claimed in claim 72, wherein said control system is arranged to control a position of said substrate stage so as to detect said mark on said substrate after said reference mark has been detected by said first mark detection system.

75. The method as claimed in claim 72, wherein said first mark detection system is arranged to detect a relative spatial relationship between said reference mark and plural shot areas on said substrate by detecting said reference mark and the mark of said substrate.

76. The method as claimed in claim 75, wherein the mark on said substrate is formed in plural positions on said substrate in accordance with said plural shot areas.

77. The method as claimed in claim 76, wherein said control system is arranged to move said substrate stage on the result of detection obtained by said first mark detection system and the result of detection obtained by said second mark detection system and to expose said plural shot areas.

78. The method as claimed in claim 72, wherein said first mark detection system is arranged to detect information on an arrangement of plural shot areas on said substrate by detecting the mark on said substrate.

79. The method as claimed in claim 78, wherein the mark on said substrate is formed in plural positions on said substrate in accordance with said plural shot areas.

80. The method as claimed in claim 79, wherein said reference mark is formed in plural positions for one of said plural shot areas.

81. The method as claimed in claim 73, wherein said second mark detection system is arranged to obtain information on a position of projection of the pattern of said mask by said projection system by detecting said reference mark.

82. The method as claimed in claim 73, wherein said second mark detection system is arranged to detect said reference mark and a mark formed on said mask through said projection system and to detect a relative spatial relationship between said reference mark and the mark formed on said mask.

83. The method as claimed in claim 82, wherein said control system is arranged to detect information on a distance between a detection reference point of said first mark detection system and a projection reference point of the pattern of said mask by said projection system on the basis of the result of detection of said reference mark obtained by said first mark detection system and the result of detection of a relative spatial relationship between the mark formed on said mask and said reference mark obtained by said second mark detection system.

84. The method as claimed in claim 72, wherein said first and second position measuring systems comprise each an interferometer.

85. The method as claimed in claim 72, wherein said control system is arranged to reset a detection value detected by said first position measuring system when said reference mark has been detected by said first mark detection system.

86. The method as claimed in claim 85, wherein the position of said substrate stage is disposed so as to deviate from a measuring area of said first position measuring system during a process of exposing plural shot areas on said substrate.

87. The method as claimed in claim 72, wherein said control system is arranged to reset a detection value detected by said second position measuring system when said reference mark has been detected through said projection system.

88. The method as claimed in claim 87, wherein the position of said substrate stage is disposed so as to deviate from a measuring area of said second position measuring system when said substrate is exchanged or when the mark on said substrate is detected by said first mark detection system.

89. The method as claimed in claim 73, wherein said reference mark comprises a first mark to be detected by said first mark detection system and a second mark to be detected by said second mark detection system, which is disposed so as to have a predetermined spatial relationship with said first mark.

90. The method as claimed in claim 89, wherein said second mark is located in a projection region of said projection system when said first mark is detected by said first mark detection system.

91. The method as claimed in claim 72, wherein said projection system is telecentric at both ends.

92. The method as claimed in claims 72, wherein said control system is arranged to move said mask in accordance with the result of detection obtained by said first mark detection system.

93. The method as claimed in claim 92, wherein said control system is arranged to detect the rotation of a shot area on said substrate in accordance with the result of detection obtained by said first mark detection system and to rotate said mask in accordance with the rotation thereof.

94. The method as claimed in claim 73, wherein said control system is arranged to move said mask in accordance with the result of detection obtained by said second mark detection system.

95. The method as claimed in claim 94, wherein said control system is arranged to detect an amount of rotation of said mask in accordance with the result of detection obtained by said first mark detection system and the result of detection obtained by said second mark detection system and to compensate for the rotation of said mask in accordance with the amount of rotation thereof.

96. The method as claimed in claim 72, further comprising:
    providing a moving mirror for position detection disposed in said substrate stage;
    wherein said reference mark is disposed in a position located between said moving mirror and said substrate.

97. The method as claimed in claim 72, further comprising providing a yawing interferometer for detecting an amount of yawing of said substrate stage, which has a measuring axis parallel to a direction in which a projection center of said projection system is connected to a detection center of said mark detection system.

98. The method as claimed in claim 73, wherein said control system is arranged to move said substrate stage in accordance with the result of detection obtained by said first mark detection system and the result of detection obtained by said second mark detection system and to project the pattern of said mask onto said substrate.

99. The method as claimed in claim 98, wherein said projection system is telecentric at both ends.

100. The method as claimed in claim 99, wherein:
    the mark on said substrate is formed in plural positions on said substrate in accordance with plural shot areas; and
    said first mark detection system is arranged to detect a relative spatial relationship between said reference mark and said plural shot areas on said substrate by detecting said reference mark and the mark on said substrate.

101. The method as claimed in claim 100, wherein said second mark detection system is arranged to detect said reference mark and a mark formed on said mask through said projection system and to obtain information on a position of projection of the pattern of said mask by said projection system.

102. The method as claimed in claim 101, wherein said control system is arranged to rotate said mask in accordance with the result of detection obtained by said first mark detection system or the result of detection obtained by said second mark detection system.

103. The method as claimed in claim 102, wherein said control system is arranged to vary an image formation characteristic of said projection system in accordance with the result of detection obtained by said first mark detection system.

104. The method as claimed in claim 103, further comprising providing a yawing interferometer for detecting an amount of yawing of said substrate stage, which has a measuring axis parallel to a direction in which a projection center of said projection system is connected to a detection center of said mark detection system.

105. A method for producing a semiconductor device comprising the steps of:
    projecting a pattern of a mask onto a substrate through a projection system using the projection method as claimed in claim 1, and
    forming the resulting substrate into a semiconductor.

106. A projection exposure method for projecting a pattern of a mask onto a plurality of shot areas on a substrate through a projection system, comprising:
    deciding a first positional relationship between respective shot areas and a reference on a substrate stage without using said projection system by using a first position measuring system which detects a position of said substrate stage, the substrate being held on the substrate stage;
    then detecting a second positional relationship between said reference and a mark formed on the mask through said projection system; and
    detecting a position of said substrate stage by using a second position measuring system different from said first position measuring system when the second positional relationship is detected, and the pattern of said mask is projected onto said plurality of shot areas.

107. The projection exposure method as claimed in claim 106, wherein the substrate stage has a reflect surface which is used by the first position measuring system and the second position measuring system to measure a position of the substrate stage.

108. The projection exposure method as claimed in claim 107, wherein the reflect surface is formed in the side surface of the substrate stage.

109. The projection exposure method as claimed in claim 107, wherein the reflect surface is arranged so as to deviate from a measuring area of said first position measuring system during a process of exposing plural shot areas on said substrate, and from a measuring area of said second position measuring system when said substrate is exchanged or when the deciding step.

110. The projection exposure method as claimed in claim 106, wherein the deciding step contains detecting a plurality of marks on the substrate and said reference by a mark detection system that has an axis different from an axis of the projection system, and wherein said plurality of marks are disposed on the substrate so as to have a predetermined positional relationship with said plurality of said shot areas.

111. The projection exposure method as claimed in claim 110, wherein said first position measuring system has a measuring axis intersecting perpendicularly with the axis of the mark detection system and the second position measuring system has a measuring axis intersecting perpendicularly with the axis of the projection system, wherein said respective measuring axes are arranged in parallel and intersecting with a direction connecting a projection center of said projection system to a detection center of said mark detection system.

112. The projection exposure method as claimed in claim 106, further comprising detecting an amount of yawing of said substrate stage by said first position measuring system and said second position measuring system.

113. The projection exposure method as claimed in claim 106, wherein said deciding step contains detecting a plurality of marks on the substrate and other reference different from said reference disposed predetermined positional relationship with said reference by a mark detection system that has an axis different from an axis of the projection system, and wherein said plurality of marks are disposed on the substrate so as to have a predetermined positional relationship with said plurality of said shot areas.

114. The projection exposure method as claimed in claim 113, wherein said reference and other reference are disposed on a same plate.

115. The projection exposure method as claimed in claim 110, wherein said substrate stage is movable between detection area of said mark detection system and projection area of said projection system on a base.

116. A method for producing a semiconductor device comprising projecting a pattern of a mask onto substrate through a projection system using the projection method as claimed in claim 106.

117. The projection exposure method as claimed in claim 107, further comprising:
detecting a plurality of marks on the substrate and the reference on the substrate by a first detection system to decide said first positional relationship, while monitoring the substrate stage by using the first position measuring system, wherein the first detection system detecting the plurality of marks on the substrate and the reference without the projection system, and wherein the second positional relationship is detected by a second detection system through the projection system.

118. The projection exposure method as claimed in claim 117, wherein the first position measuring system has a first interferometer measuring axis and the second position measuring system has a second interferometer measuring axis.

119. The projection exposure method as claimed in claim 118, wherein the first interferometer measuring axis is deviated from the reflect surface in at least a part of a sequence in which the second positional relationship is detected and the plurality of shot areas on the substrate are exposed, and the second interferometer measuring axis is deviated from the reflect surface in at least a part of a sequence in which the plurality of marks on the substrate and the reference on the substrate stage are detected.

120. The projection exposure method as claimed in claim 119, wherein said first positional relationship is determined on the basis of positional information detected by using the first interferometer measuring axis when the reference on the substrate stage is detected by said first detection system, and wherein the substrate stage is moved to expose the plurality of shot areas on the basis of positional information detected by using the second interferometer measuring axis when the second positional relationship is detected by the second detection system.

121. The projection exposure method as claimed in claim 120, wherein the reference includes a first reference for the first detection system and a second reference for the second detection system, the first reference and the second reference being arranged with predetermined positional relationship.

122. The projection exposure method as claimed in claim 121, wherein the first and second references include first and second reference marks respectively, and wherein the first detection system detects the plurality of marks on the substrate and the first reference mark, and the second detection system detects the mark on the mask and the second reference mark.

123. The projection exposure method as claimed in claim 120, wherein each of the plurality of shot areas on the substrate is aligned with the mask on the basis of the first and second positional relationship and the positional information measured by using the second interferometer measuring axis when the second positional relationship is detected, while monitoring the position of the substrate stage by using the second interferometer measuring axis.

124. The projection exposure method as claimed in claim 120, wherein the substrate stage is movable on a base.

125. The projection exposure method as claimed in claim 106, wherein the substrate is a semiconductor wafer.

126. A projection exposure apparatus for projecting a pattern of a mask onto a plurality of shot areas formed on a substrate through a projection system, comprising:
a substrate stage, disposed on an image plane side of the projection system, that loads said substrate;
a deciding device that decides a positional relationship between respective shot areas and a reference on said substrate stage without using said projection system;
a control system, connected to said substrate stage, that controls position of said substrate stage so as to detect a positional relationship between said reference and a mark formed on the mask through said projection system after said deciding device has decided said positional relationship between respective shot areas and the reference;
a first position measuring system which is connected to said control system and disposed to detect a position of said substrate stage when the positional relationship is decided by said deciding device; and
a second position measuring system different from said first position measuring system, which is connected to said control system and disposed to detect a position of said substrate stage when the positional relationship between said reference and the mark formed on the mask is detected, and the pattern of said mask is projected onto said plurality of shot areas.

127. The projection exposure apparatus as claimed in claim 126, wherein the substrate stage has a reflect surface which is used by the first position measuring system and the second position measuring system to measure a position of the substrate stage.

128. The projection exposure apparatus as claimed in claim 127, wherein the reflect surface is formed in the side surface of the substrate stage.

129. The projection exposure apparatus as claimed in claim 127, wherein the reflect surface is arranged so as to deviate from a measuring area of said first position measuring system during a process of exposing plural shot areas on said substrate, and from a measuring area of said second position measuring system when said substrate is exchanged or when the deciding device decides the positional relationship.

130. The projection exposure apparatus as claimed in claim 126, wherein the deciding device comprises a mark detection system having an axis different from an axis of the projection system, that detects a plurality of marks on the substrate and said reference, wherein said plurality of marks are disposed on the substrate so as to have a predetermined positional relationship with said plurality of said shot areas.

131. The projection exposure apparatus as claimed in claim 130, wherein said first position measuring system has a measuring axis intersecting perpendicularly with the axis of the mark detection system and the second position measuring system has a measuring axis intersecting perpendicularly with the axis of the projection system, wherein said respective measuring axes are arranged in parallel and intersecting with a direction connecting a projection center of said projection system to a detection center of said mark detection system.

132. The projection exposure apparatus as claimed in claim 126, said first position measuring system and second position measuring system detects an amount of yawing of said substrate stage respectively.

133. The projection exposure apparatus as claimed in claim 126, wherein said deciding device comprises a mark detection system having an axis different from an axis of the projection system, that detects a plurality of marks on the substrate and other reference different from said reference disposed predetermined positional relationship with said reference, wherein said plurality of marks are disposed on the substrate so as to have a predetermined positional relationship with said plurality of said shot areas.

134. The projection exposure apparatus as claimed in claim 133, wherein said reference and other reference are disposed on a same plate.

135. The projection exposure apparatus as claimed in claim 126, wherein said projection exposure apparatus is step-and-scan system.

136. A projection exposure apparatus for projecting a pattern of a mask onto a plurality of shot areas on the substrate through a projection system, comprising:
- a substrate stage disposed on an image plane side of the projection system, which has a reflect surface, the substrate being held on the substrate stage;
- a reference on the substrate stage;
- a first detection system having an objective lens through which a plurality of marks on the substrate and the reference on the substrate stage are detected in order to determine first positional relationship between the reference and the shot areas on the substrate;
- a second detection system constructed and arranged to detect second positional relationship between the reference on the substrate stage and a mark formed on the mask thorough the projection system, the second positional relationship is detected after the detection of the first positional relationship;
- a first interferometer system having a first measuring axis, which detects positional information of the substrate stage when the first detection system detects the plurality of marks on the substrate and the reference on the substrate stage:
- a second interferometer system having a second measuring axis, which detects positional information of the substrate stage when the second detection system detects the second positional relationship, and
- wherein the reflect surface is used for the first and second interferometer systems, the first measuring axis being deviated from the reflect surface when the substrate stage is moved to a position based on positional information measured by the second interferometer system, and the second measuring axis being deviated from the reflect surface when the substrate stage is moved to a position based on positional information measured by the first interferometer system.

137. The projection exposure apparatus as claimed in claim 136, wherein said first positional relationship is determined on the basis of positional information detected by the first interferometer system when the reference on the substrate stage is detected by said first detection system, and wherein each of the shot areas is aligned with the mask on the basis of positional information measured by the second interferometer system when the second positional relationship is detected by the second detection system and the first and second positional relationship.

138. The projection exposure apparatus as claimed in claim 137, wherein the reference includes a first reference for the first detection system and a second reference for the second detection system, the first reference and the second reference being arranged with predetermined positional relationship.

139. The projection exposure apparatus as claimed in claim 138, wherein the first and second references include first and second reference marks respectively, and wherein the first detection system detects the plurality of marks on the substrate arid the first reference mark and the second detection system detects the mark on the mask and the second reference mark through the projection system.

140. The projection exposure apparatus as claimed in claim 139, wherein the first and second references are disposed on a same plate.

141. The projection exposure apparatus as claimed in claim 137, wherein the substrate stage is movable on a base.

142. The projection exposure apparatus as claimed in claim 136, wherein the substrate is a semiconductor wafer.

143. A manufacturing method for producing a microdevice comprising projecting a pattern of a mask by using the projection exposure apparatus in claim 138.

* * * * *